(12) United States Patent
Sim et al.

(10) Patent No.: US 11,553,613 B2
(45) Date of Patent: Jan. 10, 2023

(54) FOLDABLE DISPLAY DEVICE

(71) Applicant: Samsung Display Co., Ltd., Yongin-si (KR)

(72) Inventors: Jin Yong Sim, Seongnam-si (KR); Se Yong Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 109 days.

(21) Appl. No.: 16/932,800

(22) Filed: Jul. 19, 2020

(65) Prior Publication Data

US 2021/0227709 A1 Jul. 22, 2021

(30) Foreign Application Priority Data

Jan. 16, 2020 (KR) .................. 10-2020-0006037

(51) Int. Cl.
*H05K 5/02* (2006.01)
*G06F 1/16* (2006.01)
*H05K 5/03* (2006.01)
*H05K 5/00* (2006.01)

(52) U.S. Cl.
CPC ......... *H05K 5/0226* (2013.01); *G06F 1/1681* (2013.01); *H05K 5/0017* (2013.01); *H05K 5/03* (2013.01)

(58) Field of Classification Search
CPC ...... H05K 5/0226; H05K 5/0017; H05K 5/03; G06F 1/1681; G06F 1/1637; G06F 1/1641; G06F 1/1652; G06F 1/1616; G06F 2203/04102; G09F 9/301; F16C 11/04

See application file for complete search history.

(56) References Cited

U.S. PATENT DOCUMENTS

| 8,908,365 | B2 * | 12/2014 | Walters ................. G06F 1/1615 |
| | | | 361/679.27 |
| 9,840,861 | B1 * | 12/2017 | Maatta ...................... E05D 1/00 |
| 10,013,028 | B2 * | 7/2018 | Ahn ...................... G06F 1/1641 |
| 10,229,629 | B2 | 3/2019 | Yang et al. |
| 10,274,996 | B2 * | 4/2019 | Lin ............................. E05F 5/08 |
| 10,331,173 | B2 * | 6/2019 | Cho ........................ G09F 9/301 |
| 10,334,090 | B2 * | 6/2019 | Kikuchi .............. H04M 1/0216 |
| 10,364,598 | B2 * | 7/2019 | Tazbaz .................. G06F 1/1681 |
| 10,386,894 | B2 * | 8/2019 | Hsu .......................... E05D 3/18 |

(Continued)

FOREIGN PATENT DOCUMENTS

| KR | 10-2014-0049911 | 4/2014 |
| KR | 10-2017-0087008 | 7/2017 |

(Continued)

*Primary Examiner* — Anthony M Haughton
*Assistant Examiner* — Theron S Milliser
(74) *Attorney, Agent, or Firm* — H.C. Park & Associates, PLC

(57) ABSTRACT

A foldable display device includes a display panel; a first support member and a second support member disposed on a surface of the display panel and respectively including first biasing members; a first member and a second member that are respectively slideably coupled to the first support member and the second support member and respectively include second biasing members; and a hinge member connected to the first member and the second member to vary an angle between the first member and the second member with respect to at least one rotation axis.

20 Claims, 20 Drawing Sheets

(56) References Cited

U.S. PATENT DOCUMENTS

| | | | | |
|---|---|---|---|---|
| 10,480,225 B1* | 11/2019 | Hsu | ............................ | E05D 3/12 |
| 10,545,541 B1* | 1/2020 | Dighde | .................. | F16M 11/06 |
| 10,564,681 B2* | 2/2020 | Siddiqui | ............... | G06F 1/1618 |
| 10,641,318 B2* | 5/2020 | Siddiqui | ............... | G06F 1/1616 |
| 10,754,377 B2* | 8/2020 | Siddiqui | ............... | G06F 1/1618 |
| 10,761,572 B1* | 9/2020 | Siddiqui | ............... | G06F 1/1616 |
| 10,798,836 B2* | 10/2020 | Manuel | ................... | E05D 3/122 |
| 10,817,023 B2* | 10/2020 | Cho | ........................ | G06F 1/1652 |
| 10,827,633 B2* | 11/2020 | Yoo | ........................ | G06F 1/1683 |
| 10,856,430 B2* | 12/2020 | Yoo | ........................ | G06F 1/1656 |
| 10,912,213 B2* | 2/2021 | Woo | ......................... | H05K 5/03 |
| 11,032,929 B2* | 6/2021 | Yoo | ........................ | G06F 1/1616 |
| 11,061,444 B2* | 7/2021 | Nakamura | ............ | G06F 1/162 |
| 2006/0138913 A1* | 6/2006 | Kim | .......................... | G09F 9/30 312/223.1 |
| 2013/0342094 A1* | 12/2013 | Walters | ................. | G06F 1/1652 312/319.2 |
| 2016/0109908 A1* | 4/2016 | Siddiqui | ............... | G06F 1/1679 361/679.27 |
| 2016/0302314 A1* | 10/2016 | Bae | ....................... | G06F 1/1616 |
| 2017/0227994 A1* | 8/2017 | Hsu | ....................... | G06F 1/1652 |
| 2017/0356227 A1* | 12/2017 | Maatta | ................. | E05D 11/1007 |
| 2017/0357289 A1* | 12/2017 | Ahn | ........................ | G06F 1/1641 |
| 2018/0049336 A1* | 2/2018 | Manuel | ..................... | E05F 1/12 |
| 2018/0066465 A1* | 3/2018 | Tazbaz | ................... | G06F 1/1681 |
| 2018/0166842 A1* | 6/2018 | Siddiqui | ............... | G06F 1/1681 |
| 2018/0210513 A1* | 7/2018 | Lin | ........................ | G06F 1/1681 |
| 2018/0292860 A1* | 10/2018 | Siddiqui | ............. | H04M 1/0216 |
| 2018/0324964 A1* | 11/2018 | Yoo | ........................ | H05K 1/189 |
| 2018/0375976 A1* | 12/2018 | Kikuchi | ............... | H04M 1/0247 |
| 2019/0200470 A1* | 6/2019 | Woo | ........................ | H05K 5/03 |
| 2019/0278338 A1* | 9/2019 | Siddiqui | ............... | G06F 1/1616 |
| 2020/0137908 A1* | 4/2020 | Yoo | ........................ | G06F 1/1681 |
| 2020/0241604 A1* | 7/2020 | Nakamura | ............ | G06F 1/1618 |
| 2020/0396852 A1* | 12/2020 | Yoo | ........................ | E05D 11/06 |
| 2021/0119171 A1* | 4/2021 | Kim | ........................ | E05D 3/18 |
| 2021/0165458 A1* | 6/2021 | Lee | ....................... | G06F 1/1616 |
| 2021/0298186 A1* | 9/2021 | Yoo | ........................ | E05D 11/06 |

FOREIGN PATENT DOCUMENTS

| | | |
|---|---|---|
| KR | 10-2018-0043441 | 4/2018 |
| KR | 10-2018-0076271 | 7/2018 |
| KR | 10-2019-0001389 | 1/2019 |

* cited by examiner

FIG. 7
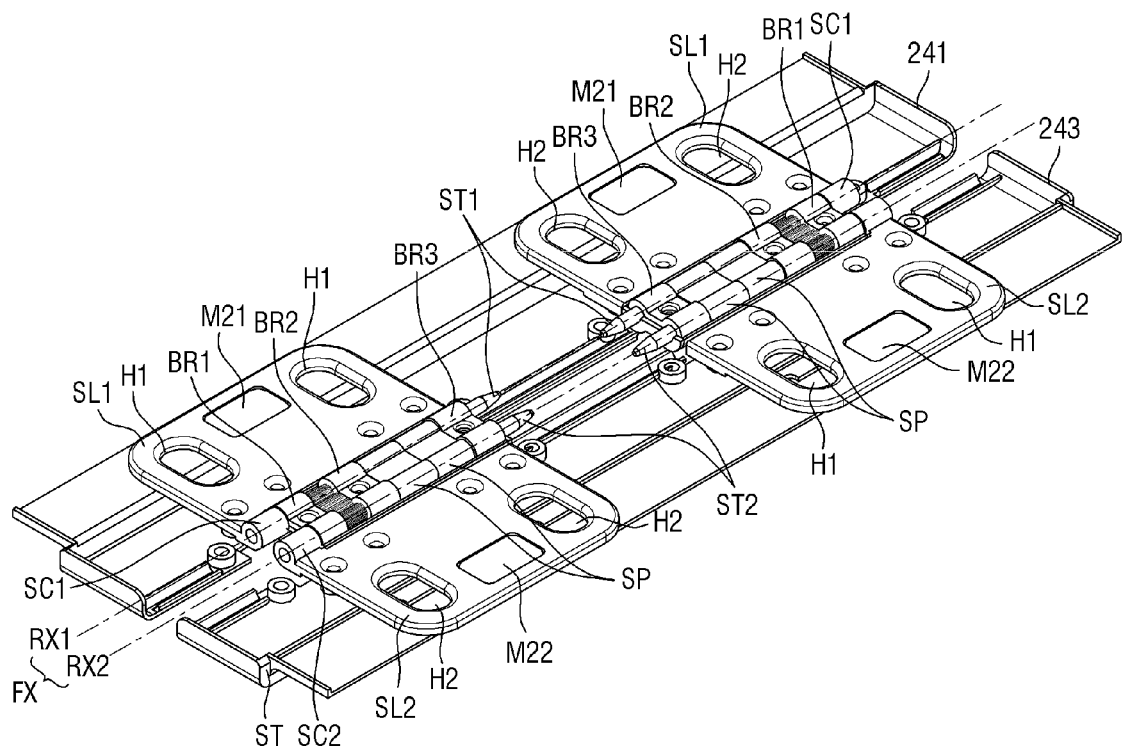
HG: ST1, ST2, IG2, IG2, BR1, BR2, BR3
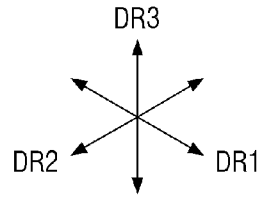

FIG. 10
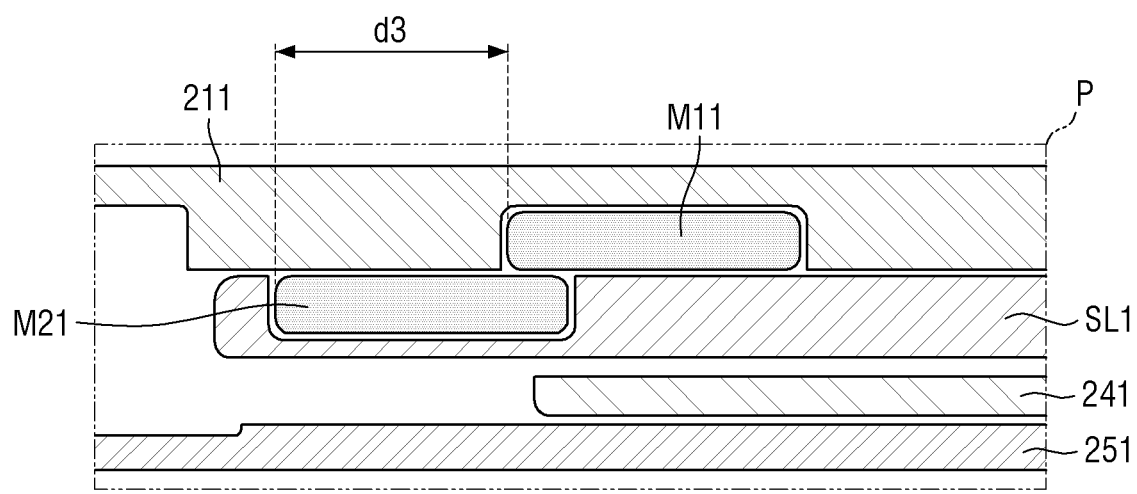
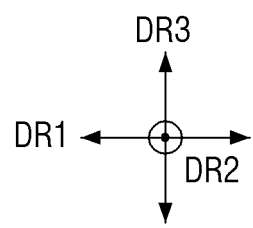

FOLDABLE DISPLAY DEVICE

CROSS REFERENCE TO RELATED APPLICATION

This application claims priority from and the benefit of Korean Patent Application No. 10-2020-0006037, filed on Jan. 16, 2020, which is hereby incorporated by reference for all purposes as if fully set forth herein.

BACKGROUND

Field

Exemplary implementations of the invention relate generally to a foldable display device and, more particularly to foldable display having a hinged support member.

Discussion of the Background

A display device is a device for displaying an image and includes a display panel such as an organic light emitting display panel including organic light emitting diodes (OLEDs) or quantum dot electroluminescence (QD-EL) devices or a liquid crystal display panel.

A mobile electronic device includes a display device to provide an image to a user. The proportion of mobile electronic devices having a larger display screen while having the same or smaller volume or thickness than conventional mobile electronic devices is increasing, and foldable display devices or bendable display devices structured to be folded and unfolded in order to provide a larger screen only when used are also being developed.

The above information disclosed in this Background section is only for understanding of the background of the inventive concepts, and, therefore, it may contain information that does not constitute prior art.

SUMMARY

Applicant discovered that a hinge for folding and unfolding foldable display devices may not be reliable due to stresses caused by folding and unfolding operations.

Foldable display devices constructed according to the principles and exemplary implementations of the invention provide reliable folding and unfolding operations. For example, the foldable display device includes a hinge member having a lost motion connection to reduce stresses during folding and unfolding operations.

Specifically, in some exemplary implementations, the lost motion connection may be formed by sliding members slideably coupled between the hinge member and support members that support the display panel in the foldable display device such that a tensile or compressive forces generated in the display panel due to the folding and unfolding operations are reduced or eliminated. Further, the sliding member may include one of more biasing members such as magnetic or elastic members to control the torque generated when folding or unfolding of the foldable display device to provide for reliable folding and unfolding operations. Thus, the foldable display panel can be easily folded or unfolded, maintain an angle in a folded position or an unfolded position, and minimize noise caused by the folding and unfolding operations.

According to one or more exemplary implementations, folding or unfolding operations in the foldable display device can be easily performed.

According to one or more exemplary implementations, the angle between the foldable portions of the foldable display device can be maintained in a folded position or an unfolded position.

According to one or more exemplary implementations, noise caused by a folding or unfolding operation of the foldable display device can be minimized.

Additional features of the inventive concepts will be set forth in the description which follows, and in part will be apparent from the description, or is learned by practice of the inventive concepts.

According to one aspect of the invention a foldable display device includes a display panel; a first support member and a second support member disposed on a surface of the display panel and respectively including first biasing members; a first member and a second member that are respectively slideably coupled to the first support member and the second support member and respectively include second biasing members; and a hinge member connected to the first member and the second member to vary an angle between the first member and the second member with respect to at least one rotation axis.

The first support member and the second support member may be supported for limited relative movement according to the angle between the first member and the second member.

When the angle between the first member and the second member is changed, a distance between each first biasing member from the at least one rotation axis may be changed, and a distance between each second biasing member from the at least one rotation axis may be kept substantially constant.

The first support member and the second support member may have a folded position in which the first support member and the second support member overlap in a thickness direction and an unfolded position in which the first support member and the second support member are arranged side by side along a direction intersecting the at least one rotation axis, and a distance between the first biasing members and the second biasing members in the folded position may be greater than a distance between the first biasing members and the second biasing members in the unfolded position.

The first biasing members may be disposed closer to the at least one rotation axis than the second biasing members in the folded position.

The first biasing members and the second biasing members may at least partially overlap in the thickness direction.

An overlap area between each first magnet and a corresponding second magnet in the unfolded position may be greater than an overlap area between each first magnet and the corresponding second magnet in the folded position.

The first and the second biasing members may comprise first and second magnets having different polarities.

Each of the first member and the second member may comprise a slideable member including: a plate part extending in the direction intersecting the at least one rotation axis; a shaft coupling part disposed at an end of the plate part on a side adjacent to the at least one rotation axis; and a pair of guide holes extending through the plate part in a thickness direction and arranged in a direction substantially parallel to the at least one rotation axis. Each of the second biasing members may be disposed between the pair of guide holes.

The foldable display device may further comprise a first back cover covering a back surface of the first support member; a second back cover covering a back surface of the second support member; a first slide cover being slideably coupled to the first back cover; and a second slide cover being slideably coupled to the second back cover.

The first slide cover may cover an area between the at least one rotation axis and an end of the first back cover adjacent to the at least one rotation axis, and the second slide cover may cover an area between the at least one rotation axis an end of the second back cover adjacent to the at least one rotation axis.

At least a part of the first slide cover may overlap the first back cover in the thickness direction, and at least a part of the second slide cover may overlap the second back cover in the thickness direction.

The foldable display device may further comprise a hinge cover disposed between the first slide cover and the second slide cover and covering a back surface of the hinge member.

The first support member and the second support member may respectively further comprise auxiliary biasing members disposed farther from the at least one rotation axis than the first biasing members and the second biasing members.

The first and second biasing members may comprise first and second magnets, the auxiliary biasing members comprise auxiliary magnets, and a magnetic force between the auxiliary magnets is smaller than a magnetic force between the first magnets and the second magnets.

According to another aspect of the invention a foldable display device includes a display panel; a first support member and a second support member disposed on a surface of the display panel; a first member and a second member that are respectively slideably coupled to the first support member and the second support member and respectively comprise biasing members; and a hinge member connected to the first member and the second member to vary an angle between the first member and the second member with respect to at least one rotation axis, wherein the biasing members are configured to change a length according to an angle between the first support member and the second support member.

The biasing members may comprise elastic members, and each of the first member and the second member may comprise a slideable member including: a plate part extending in a direction intersecting the at least one rotation axis; a shaft coupling part disposed at an end of the plate part on a side adjacent to the at least one rotation axis; an elastic member accommodating hole extends through the plate part in a thickness direction; and a fixing member to secure the elastic member in the elastic member accommodating hole in the direction intersecting the at least one rotation axis.

The foldable display device may further comprising: a first back cover covering a back surface of the first support member, and a second back cover covering a back surface of the second support member, wherein the first back cover and the second back cover may respectively comprise support walls protruding from front surfaces of the first back cover and the second back cover and inserted into the elastic member accommodating holes, and wherein ends of the elastic members may be supported by the fixing members, and the other ends of the elastic members are supported by the support walls.

A gap between each support wall and an inner side surface of a corresponding elastic member accommodating hole may vary according to the angle between the first sliding member and the second sliding member.

The first support member and the second support member may have a folded position in which the first support member and the second support member overlap in the thickness direction and an unfolded position in which the first support member and the second support member are arranged side by side along the direction intersecting the at least one rotation axis, and the elastic members may be compressed in the folded position and stretched in the unfolded position.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7 is a perspective view of a connection member, a hinge cover and a slide cover of FIG. 3;

FIG. 10 is an enlarged view of a portion P of FIG. 9;

DETAILED DESCRIPTION

Figure 1:
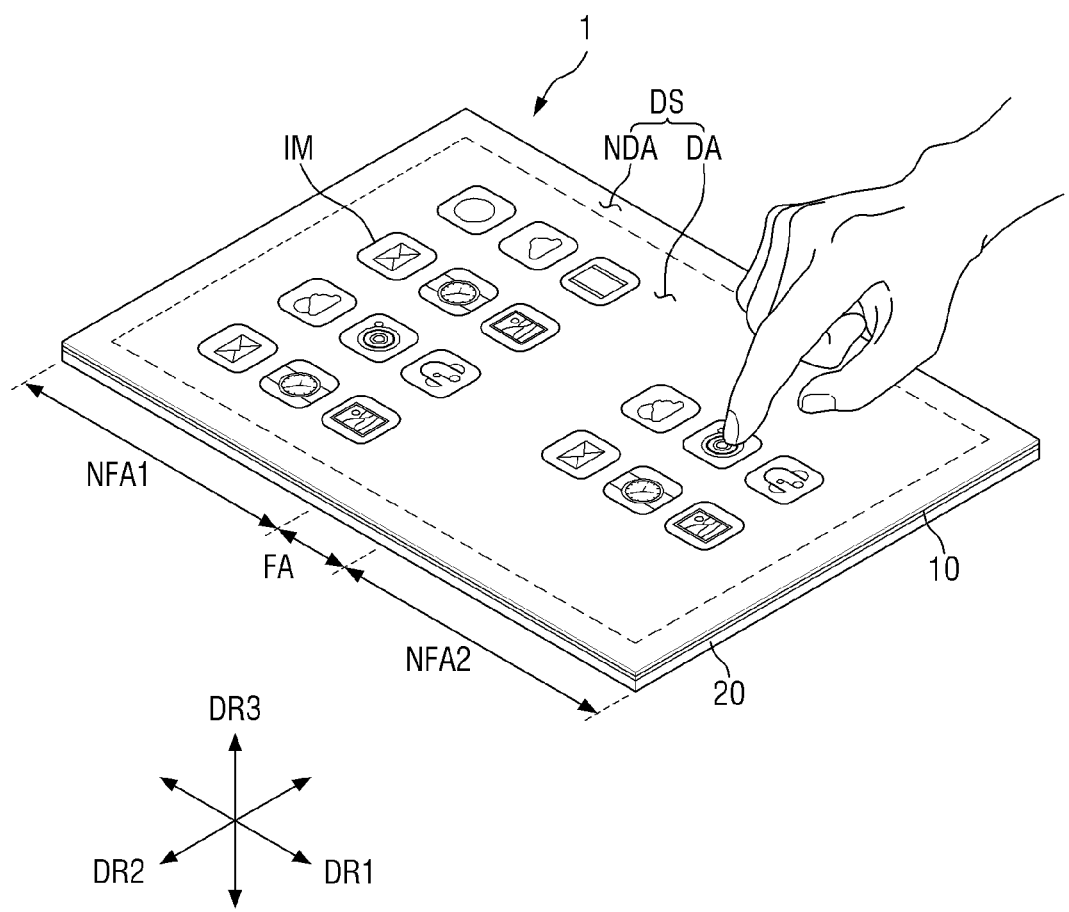
FIG. 1 is a perspective view of an exemplary embodiment of a foldable display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, exemplary embodiments will be described with reference to the attached drawings.

Figure 2:
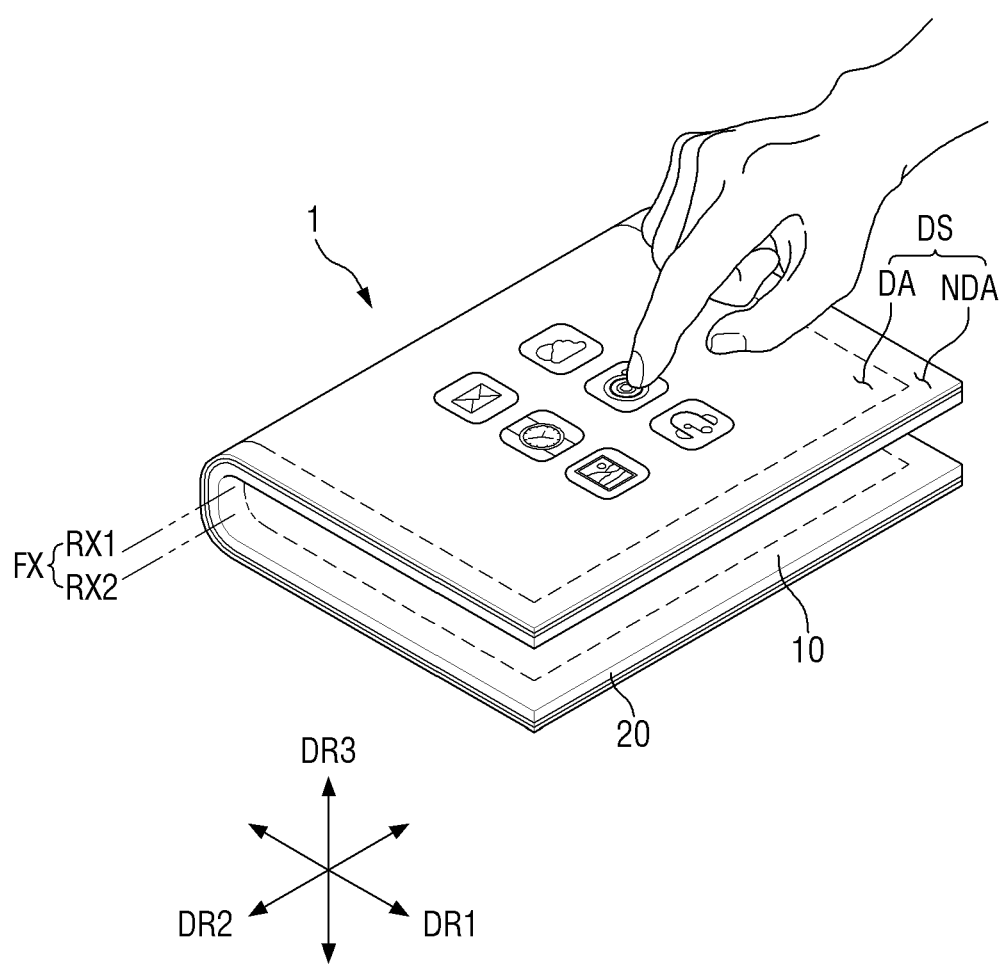
FIG. 2 is a perspective view of the foldable display device of FIG. 1 in a folded position.

FIG. 1 is a perspective view of an exemplary embodiment of a foldable display device 1 constructed according to the principles of the invention. FIG. 2 is a perspective view of the foldable display device 1 of FIG. 1 in a folded position.

In exemplary embodiments, a first direction DR1, a second direction DR2, and a third direction DR3 intersect each other in different directions. In the perspective view of FIG. 1, a horizontal direction of the foldable display device 1 is defined as the first direction DR1, a vertical direction as the second direction DR2, and a thickness direction as the third direction DR3 for ease of description.

For ease of description, an upward direction (DR3) of FIG. 1 is referred to as a forward direction, and a direction opposite to the forward direction is referred to as a backward direction. In addition, a surface perpendicular to the forward direction is referred to as a front surface, and a surface opposite to the front surface is referred to as a back surface. However, directions mentioned in exemplary embodiments may be understood as relative directions, and the exemplary embodiments are not limited to the mentioned directions.

The foldable display device 1 according to exemplary embodiments may be implemented in various devices for displaying a screen or an image. For example, the foldable display device 1 may be, but is not limited to, a foldable smartphone, a foldable tablet personal computer (PC), or a foldable notebook computer.

Referring to FIGS. 1 and 2, the foldable display device 1 may be generally shaped like a rectangle having long sides extending in the first direction DR1 and short sides extending in the second direction DR2 intersecting the first direction DR1. However, exemplary embodiments are not limited to this case, and the foldable display device 1 may have various other shapes.

A display surface DS may be defined in the foldable display device 1. For example, as illustrated in FIG. 1, a front surface substantially parallel to the first direction DR1 and the second direction DR2 may be defined as the display surface DS. Images IM may be provided to a user through the display surface DS.

A plurality of display surfaces DS may be defined in the foldable display device 1. For example, the display surfaces DS may be defined on two or more of the front surface, a back surface, and side surfaces extending between the front surface and the back surface of the foldable display device 1. In the illustrated exemplary embodiment, the display surface DS defined only on one surface for convenience as described below.

The display surface DS may include a display area DA and a non-display area NDA around the display area DA. The display area DA may display an image, and the non-display area NDA may not display an image. The non-display area NDA may surround the display area DA and may include an edge part of the foldable display device 1 which is printed in a predetermined color.

The display surface DS may be disposed in and extend over a folding area FA and non-folding areas NFA1 and NFA2 which will be described later.

The foldable display device 1 may be folded or unfolded. Here, the term 'folded' may include various degrees on bending to produce various 'bent' shapes. Specifically, the foldable display device 1 may be folded such that a part of the foldable display device 1 overlaps the other part thereof or is inclined to the other part. Alternatively, the whole of the foldable display device 1 may be spread flat out.

The foldable display device 1 may be folded such that a part of the back surface faces the other part thereof. In other words, the foldable display device 1 may be folded such that a part of the back surface forms a straight angle or less than a straight angle with the other part of the back surface. The foldable display device 1 may also be folded such that a part of the front surface faces the other part thereof.

The foldable display device 1 may be folded such that a part of the display surface DS does not face the other part thereof. In other words, the foldable display device 1 may be folded such that a part of a rear surface opposite to the display surface DS faces the other part the rear surface. For example, as illustrated in FIG. 2, the foldable display device 1 may be folded such that a part of the front surface, on which the display surface DS is defined, does not face the other part of the front surface. In other words, the foldable display device 1 may be outwardly folded. In the following description, the folded position refers to as a position in which the foldable display device 1 is outwardly folded, but the exemplary embodiments are not limited thereto and may be inwardly folded as well.

The foldable display device 1 may have a folded position and an unfolded position. The folded position includes a position in which the foldable display device 1 is bent. Specifically, the folded position may be a position in which the foldable display device 1 is bent such that a part of the foldable display device 1 is inclined to the other part thereof. The unfolded position may be a position in which a part of the foldable display device 1 is placed side by side with the other part thereof to form a substantially planar configuration. Alternatively, the folded position may be a position in which an angle between a part and the other part of the foldable display device 1 is about 0 to less than 180 degrees and/or greater than about 180 to less than 360 degrees. The unfolded position may be a position in which an angle between a part and the other part of the foldable display device 1 is about 180 degrees. Here, a part and the other part of the foldable display device 1 may respectively be the non-folding areas NFA1 and NFA2 which will be described later.

The foldable display device 1 may be divided into the folding area FA and the non-folding areas NFA1 and NFA2. The folding area FA is an area that is folded as the foldable display device 1 is bent. In other words, the folding area FA is an area that is bent as the foldable display device 1 is folded. The non-folding areas NFA1 and NFA2 are areas that are not folded or bent. In other words, the non-folding areas NFA1 and NFA2 may be areas that are substantially flat regardless of whether the foldable display device 1 is folded. The non-folding areas NFA1 and NFA2 may be arranged in the first direction DR1, and the folding area FA may be disposed between the non-folding areas NFA1 and NFA2. In an exemplary embodiment, one folding area FA is defined in the foldable display device 1. However, a plurality of folding areas FA may also be defined in the foldable display device 1.

The foldable display device 1 may be folded or unfolded about a folding axis FX. For example, the foldable display device 1 may be folded or unfolded with respect to the folding axis FX disposed in the second direction DR2.

The folding axis FX includes one or more rotation axes RX1 and RX2. The folding axis FX may include a first rotation axis RX1 and a second rotation axis RX2 adjacent to each other. For example, the foldable display device 1 may be folded or unfolded with respect to the first rotation axis RX1 and the second rotation axis RX2 to have two centers of curvature. The first and second rotation axes RX1 and RX2 may be in the folding area FA.

For ease of description, a direction toward the folding axis FX is referred to as a first side direction (e.g., an inward direction), and a direction opposite to the first side direction is referred to as a second side direction (e.g., an outward direction).

The foldable display device 1 includes a display module 10 and a folding member 20. The display module 10 and the folding member 20 will now be described in detail with reference to FIGS. 3 through 20.

Figure 3:
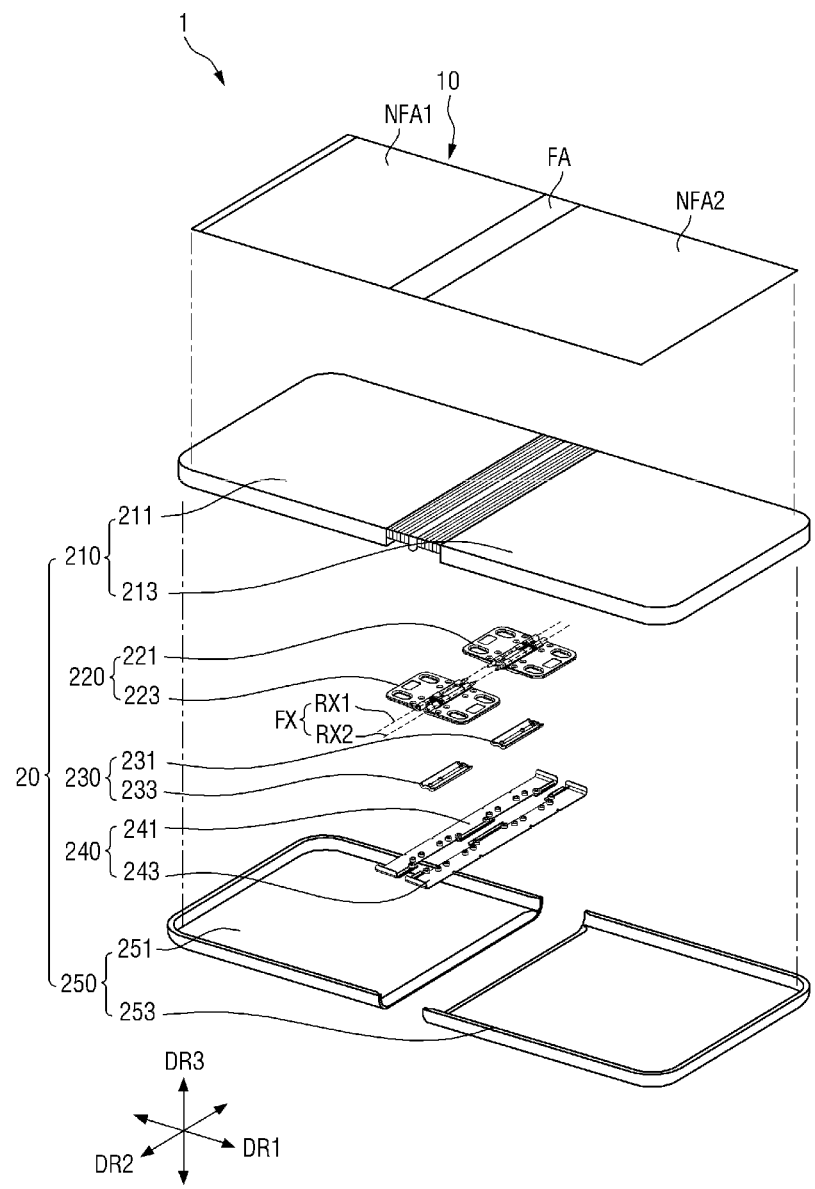
FIG. 3 is an exploded perspective view of the foldable display device of FIG. 1 in an unfolded position.

FIG. 3 is an exploded perspective view of the foldable display device 1 of FIG. 1 in an unfolded position. Referring to FIG. 3, the display module 10 is disposed at the front of the foldable display device 1. The display module 10 may have flexibility. The display module 10 may be disposed over the folding area FA and the non-folding areas NFA1 and NFA2 and may be folded around the folding area FA.

The folding member 20 is disposed on a back surface of the display module 10 and supports the display module 10. The folding member 20 is folded together with the display module 10 as the foldable display device 1 is folded. For example, the display module 10 having flexibility may be folded by the folding member 20.

The folding member 20 may include a support member 210, a connection member 220, a hinge cover 230, a slide cover 240, and a back cover 250.

The support member 210 is disposed on the back surface of the display module 10 and may take various forms and configurations that function to support the display module 10. The support member 210 also may dissipate heat generated from the inside while supporting the display module 10. For example, the support member 210 may be a metal plate containing a material with excellent thermal conductivity, e.g., copper or silver. In another exemplary embodiment, the support member 210 may be a heat dissipating sheet containing, e.g., graphite or carbon nanotubes. The support member 210 may include a first support member 211 and a second support member 213.

The first support member 211 may be disposed on a side of the folding axis FX in the second direction DR2, and the second support member 213 may be disposed on the other side of the folding axis FX in the second direction DR2. The first support member 211 and the second support member 213 may be separated from each other or at least partially connected to each other. The first support 211 and the second support member 213 may be disposed symmetrically with respect to the folding axis FX.

The folding member 20 may further include an intermediate part having flexibility which is disposed between the first support member 211 and the second support member 213. The intermediate part may connect a side of the first support member 211 and a side of the second support member 213.

The connection member 220 may be disposed under the support member 210. The connection member 220 is disposed on the folding axis FX and connects the side of the first support member 211 and the side of the second support member 213 such that an angle between the first support member 211 and the second support member 213 is changed according to the movement of the connection member 220. The side of the first support member 211 and the side of the second support member 213 are adjacent to the folding axis FX. The connection member 220 may include a first connection member 221 and a second connection member 223 disposed along the folding axis FX.

The hinge cover 230 is disposed under the connection member 220 to cover at least a part of the connection member 220. Specifically, the hinge cover 230 may be disposed between a first slide cover 241 and a second slide cover 243 which will be described later and may cover hinge members HG of the connection member 220 which will be described later. The hinge cover 230 may include a first hinge cover 231 covering the hinge member HG of the first connection member 221 and a second hinge cover 233 covering the hinge member HG of the second connection member 223.

The slide cover 240 is disposed under the support member 210 to cover the support member 210 and the connection member 220. The slide cover 240 may slide with respect to the back cover 250 when the foldable display device 1 is folded or unfolded. The slide cover 240 may include the first slide cover 241 covering a back surface of the first support member 211 and the second slide cover 243 covering a back surface of the second support member 213.

The connection member 220, the hinge cover 230, and the slide cover 240 will be described in detail later with reference to FIGS. 6 through 8.

The back cover 250 is disposed under the support member 210. The back cover 250 may include a first back cover 251 and a second back cover 253.

The first back cover 251 may be disposed on the back surface of the first support member 211 to cover the first support member 211. The first back cover 251 may cover a part of the hinge cover 230 (e.g., a left end of a back surface of the hinge cover 230) disposed between the first support member 211 and the second support member 213. The first back cover 251 may have rounded corners. The first back cover 251 may have an empty space therein or may form an empty space for accommodating the first support member 211 such that the first back cover 251 is coupled to the first support member 211. For example, the first back cover 251 may have a structure including a quadrilateral bottom surface and three sidewalls extending from the bottom surface. For example, a side of the back cover 250 corresponding to the connection member 220 may be open without a sidewall. For example, the second back cover 253 may have substantially the same structure as the first back cover 251, and may be adjacent to the first back cover 251.

Figure 4:
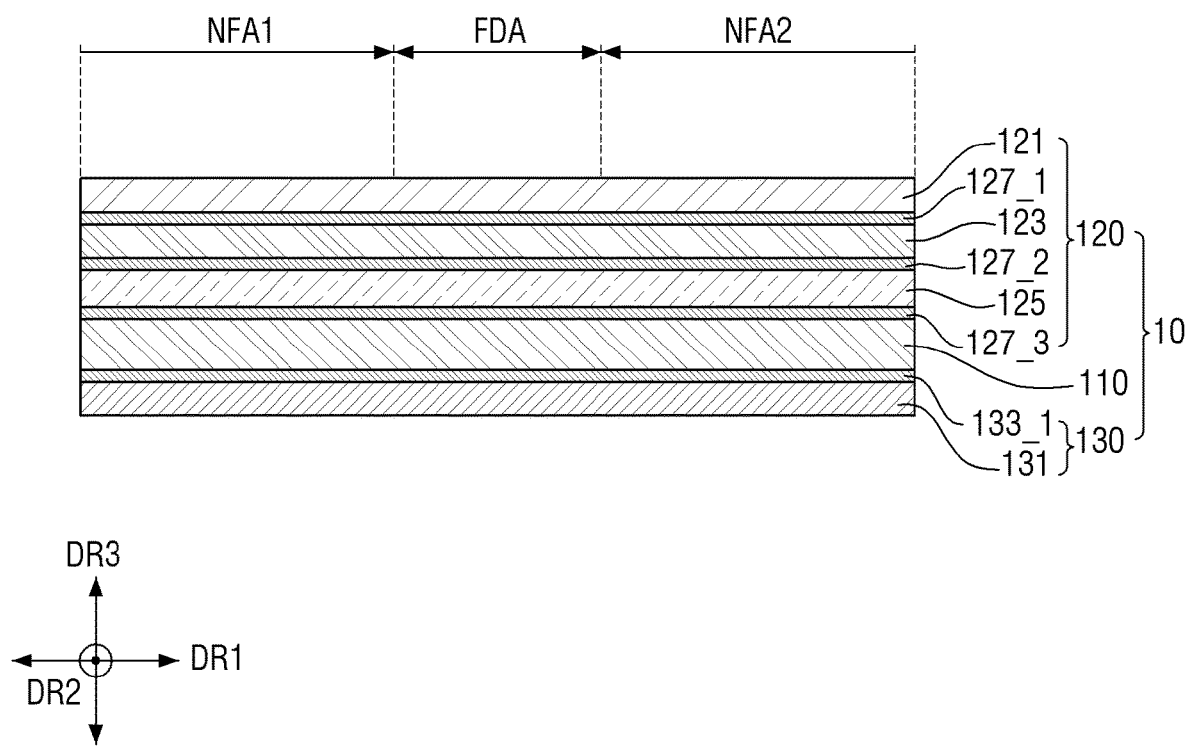
FIG. 4 is a cross-sectional view of a display module of FIG. 3.
Figure 5:
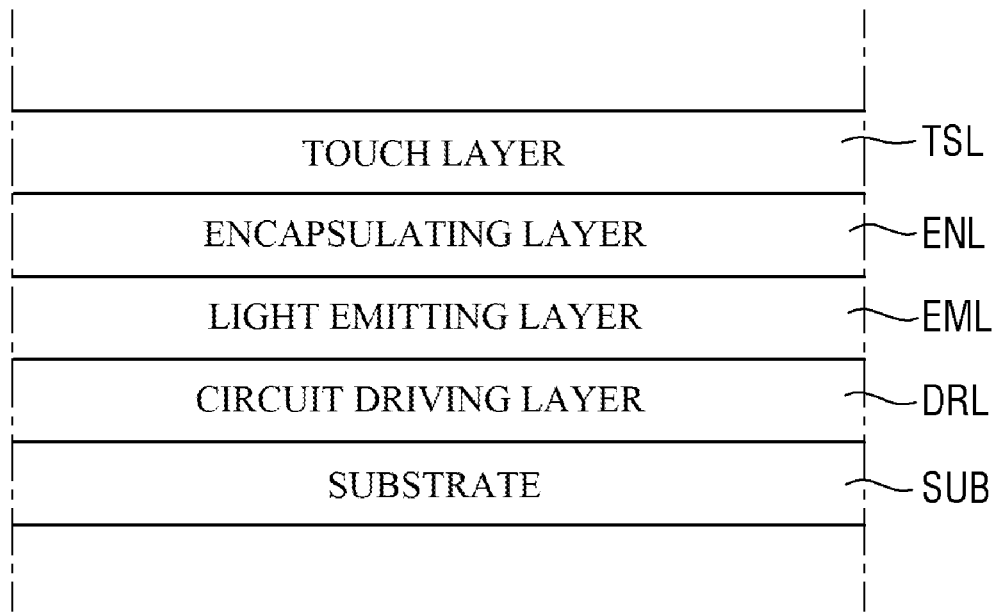
FIG. 5 is a cross-sectional view of a display panel of FIG. 4.

FIG. 4 is a cross-sectional view of the display module 10 of FIG. 3. FIG. 5 is a cross-sectional view of a display panel 110 of FIG. 4.

Referring to FIG. 4, the display module 10 may include the display panel 110, a front stack structure 120, and a back stack structure 130. Each of the front and back stack structures 120 and 130 may include at least one bonding member or adhesive layer. The display panel 110 may be disposed between the front and back stack structures 120 and 130.

The display panel 110 may generate an image and provide the image to a user. For example, the display panel 110 may include a self-luminous display panel such as an organic light emitting display panel, an inorganic electroluminescent (EL) display panel, a quantum dot light emitting display (QED) panel, a micro-light emitting diode (LED) display panel, a nano-LED display panel, a plasma display panel (PDP), a field emission display (FED) panel, or a cathode ray tube (CRT) display panel. Alternatively, the display panel 110 may include a light receiving display panel such as a liquid crystal display (LCD) panel or an electrophoretic display (EPD) panel. An organic light emitting display panel will hereinafter be described as an example of the display panel 110. However, exemplary embodiments are not limited to the organic light emitting display panel, and other display panels listed above or known in the art are also applicable.

The display panel 110 may further include a touch member. The touch member may be implemented in a panel or film separate from the display panel 110 and attached onto the display panel 110. Alternatively, the touch member may be implemented in the form of a touch layer inside the display panel 110. In the following exemplary embodiments, a case where the touch member is provided and included in the display panel 110 will be described.

Referring to FIG. 5, the display panel 110 may include a substrate SUB, a circuit driving layer DRL disposed on the substrate SUB, a light emitting layer EML disposed on the circuit driving layer DRL, an encapsulating layer ENL disposed on the light emitting layer EML, and a touch layer TSL disposed on the encapsulating layer ENL.

The substrate SUB may be a flexible substrate including a flexible polymer material such as polyimide. Thus, the display panel 110 may be bent, folded, or rolled. In some exemplary embodiments, the substrate SUB may include a plurality of sub-substrates stacked with a barrier layer interposed therebetween and overlapping each other in the thickness direction. In this case, each sub-substrate may be a flexible substrate.

The circuit driving layer DRL may be disposed on the substrate SUB. The circuit driving layer DRL may include a circuit for driving the light emitting layer EML of each pixel. The circuit driving layer DRL may include a plurality of thin-film transistors.

The light emitting layer EML may be disposed on the circuit driving layer DRL. The light emitting layer EML may include an organic light emitting layer. The light emitting layer EML may emit light of various luminance levels according to a driving signal received from the circuit driving layer DRL.

The encapsulating layer ENL may be disposed on the light emitting layer EML. The encapsulating layer ENL may include an inorganic layer or a laminate of an inorganic layer and an organic layer.

The touch layer TSL may be disposed on the encapsulating layer ENL. The touch layer TSL is a layer for recognizing a touch input and may function as the touch member. The touch layer TSL may include a plurality of sensing regions and sensing electrodes.

Referring again to FIG. 4, the front stack structure 120 is disposed in front of the display panel 110. The front stack structure 120 may include a polarizing member 125, a cover window 123, and a cover window protective layer 121 stacked sequentially on the display panel 110 in the forward direction.

The polarizing member 125 polarizes light that passes therethrough. The polarizing member 125 may reduce reflection of external light. In an exemplary embodiment, the polarizing member 125 may be a polarizing film. The polarizing film may include a polarizing layer and protective substrates sandwiching the polarizing layer from above and under the polarizing layer. The polarizing layer may include a polyvinyl alcohol film. The polarizing layer may be stretched in one direction. The stretching direction of the polarizing layer may be an absorption axis, and a direction perpendicular to the stretching direction may be a transmission axis. The protective substrates may be disposed on one surface and the other surface of the polarizing layer, respectively. The protective substrates may be made of, but not limited to, cellulose resin such as triacetyl cellulose or polyester resin.

The cover window 123 may be disposed in front of the polarizing member 125. The cover window 123 protects the display panel 110. The cover window 123 may be made of a transparent material. The cover window 123 may be made of, e.g., glass or plastic.

When the cover window 123 includes glass, the glass may be ultra-thin glass (UTG) or thin-film glass. Since the UTG or the thin-film glass has flexible properties, it may be bent, folded, or rolled. The glass may have a thickness of, e.g., about 10 to 300 µm, specifically, about 30 to 80 µm, or about 50 µm. The glass of the cover window 123 may include soda lime glass, alkali aluminosilicate glass, borosilicate glass, or lithium aluminasilicate glass. The glass of the cover window 123 may include chemically or thermally tempered glass to increase strength. The chemical tempering may be achieved through an ion exchange process performed in alkali salts. The ion exchange process may be performed two or more times.

When the cover window 123 includes plastic, the cover window 123 may have better flexible properties for folding. Examples of the plastic applicable to the cover window 123 may include, but are not limited to, polyimide, polyacrylate, polymethyl methacrylate (PMMA), polycarbonate (PC), polyethylene naphthalate (PEN), polyvinylidene chloride, polyvinylidene difluoride (PVDF), polystyrene, ethylene vinylalcohol copolymer, polyethersulfone (PES), polyetherimide (PEI), polyphenylene sulfide (PPS), polyallylate, triacetyl cellulose (TAC), and cellulose acetate propionate (CAP). The plastic cover window 123 may include one or more of the plastic materials listed above.

The cover window protective layer 121 may be disposed in front of the cover window 123. The cover window protective layer 121 may perform at least one of scattering prevention, shock absorption, dent prevention, fingerprint prevention, and anti-glare functions for the cover window 123. The cover window protective layer 121 may include a transparent polymer film. The transparent polymer film may include at least one of polyethylene terephthalate (PET), polyethylene naphthalate (PEN), polyethersulfone (PES), polyimide (PI), polyacrylate (PAR), polycarbonate (PC), polymethyl methacrylate (PMMA), and cycloolefin copolymer (COC).

The front stack structure 120 may include a plurality of front bonding members 127_1 through 127_3 which bond adjacent stacked members together.

The back stack structure 130 is disposed under the display panel 110. The back stack structure 130 may include a polymer film layer 131.

The polymer film layer 131 may include a polymer film. The polymer film layer 131 may include, for example, polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), or cyclo olefin polymer (COP). The polymer film layer 131 may include a functional layer on at least one surface. The functional layer may include, for example, a light absorbing layer. The light absorbing layer may include a light absorbing material such as a black pigment or dye. The light absorbing layer may be formed on the polymer film by coating or printing black ink on the polymer film.

The back stack structure 130 may include a back bonding member 133_1 which bonds the display panel 110 and the polymer film layer 131 together.

When the display device 10 displays an image only on the front surface, the back bonding member 133_1 does not need to be optically clear, unlike the front bonding members 127_1 through 127_3.

Each of the front bonding members 127_1 through 127_3 and the back bonding member 133_1 may include an adhesive material. Each of the front bonding members 127_1 through 127_3 and the back bonding member 133_1 may consist of a single adhesive layer or a plurality of stacked adhesive layers or may include adhesive layers, like a double-sided tape, disposed on a surface and the other surface of a substrate, respectively.

The connection member 220, the hinge cover 230, and the slide cover 240 will now be described in detail with reference to FIGS. 6 through 8.

Figure 6:
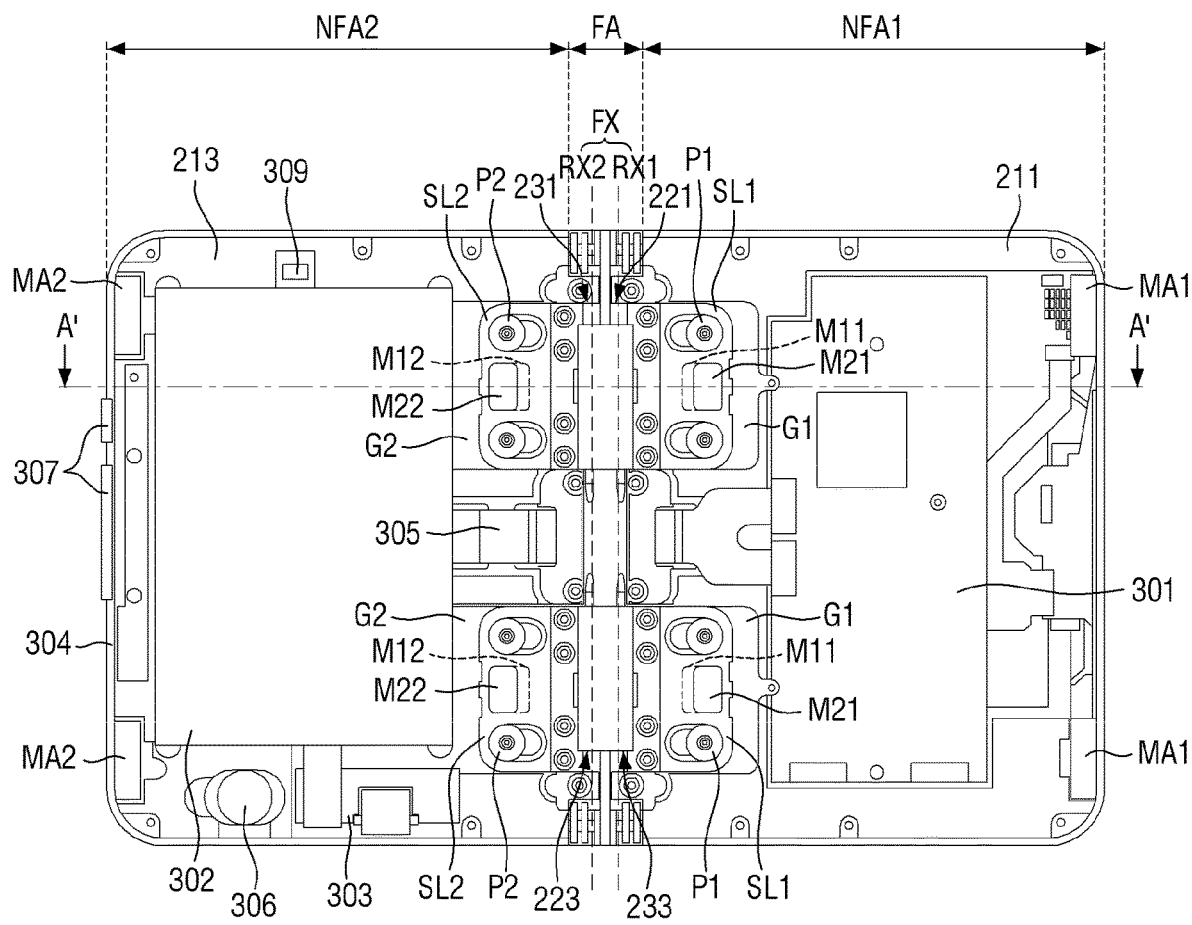
FIG. 6 is a plan view of a back surface of the foldable display device of FIG. 1 in an unfolded position.

FIG. 6 is a plan view of the back surface of the foldable display device 1 of FIG. 1 in an unfolded position. For ease of description, the slide cover 240 and the back cover 250 are not illustrated. Referring to FIG. 6, a space for mounting electronic components may be provided on the back surface of each of the first support member 211 and the second support member 213. Specifically, the back surface of the first support member 211 or the second support member 213 may be recessed to a predetermined depth in the thickness direction to form at least one space for mounting electronic components. In this space, electronic components such as a main printed circuit board (PCB) 301 for driving the display module 10, a battery 302, sub-PCBs 303 and 304 for operating a universal serial bus (USB) or buttons, a flexible PCB (FPCB) 305 connecting the main PCB 301 and the battery 302, a speaker 306, buttons 307, and a sensing magnet 309 may be mounted.

The first support member 211 and the second support member 213 respectively include one of more biasing members that may take the form of first magnets M11 and M12 to is adjusting the torque required to fold or unfold the foldable display device 1. In FIG. 6, the first magnets M11 and M12 are indicated by dotted lines because they are hidden by sliding members SL1 and SL2 which will be described later. The arrangement of the first magnets M11 and M12 and second magnets M21 and M22 will be described in detail later with reference to FIGS. 9 through 14.

The first support member 211 and the second support member 213 may further include auxiliary magnets MA1 and MA2, protruding members P1 and P2, and guide grooves G1 and G2, respectively.

The auxiliary magnets MA1 and MA2 are disposed on the first support member 211 and the second support member 213 to be substantially symmetrical with respect to an area between the first support member 211 and the second support member 213. The auxiliary magnets MA1 and MA2 may respectively be disposed farther from the folding axis FX than the first magnets M11 and M12 or the second magnets M21 and M22 which will be described later. For example, the auxiliary magnets MA1 and MA2 may be disposed adjacent to opposite edges of the first support member 211 and the second support member 213, respectively.

The auxiliary magnets MA1 and MA2 may adjust the torque for folding or unfolding the foldable display device 1. Specifically, the auxiliary magnets MA1 of the first support member 211 and the auxiliary magnets MA2 of the second support member 213 may have the same polarity. Thus, the foldable display device 1 in the folded position can be easily switched to the unfolded position by the repelling force between the auxiliary magnets MA1 and MA2 with the same polarity. Alternatively, the auxiliary magnets MA1 of the first support member 211 and the auxiliary magnets MA2 of the second support member 213 may have different polarities. Thus, the foldable display device 1 in the folded position may not be easily switched to the unfolded position by the attracting force between the auxiliary magnets MA1 and MA2 with the different polarities.

The protruding members P1 and P2 are fixed to the back surface of the support member 210 and protrude to a predetermined height from the back surface of the support member 210. The protruding members P1 and P2 are inserted into guide holes H1 and H2 of the sliding members SL1 and SL2 to be described later and guide sliding directions of the sliding members SL1 and SL2 of the connection member 220, which form a lost motion connection that reduces stress due to folding and unfolding operations. In an exemplary embodiment, side surfaces of the protruding members P1 and P2 may have protrusions and recesses. The protrusions and recesses of the protruding members P1 and P2 may be coupled to protrusions and recesses of the guide holes H1 and H2 formed on inner side surfaces thereof. Thus, separation of the sliding members SL1 and SL2 from the support member 210 may be prevented.

The guide grooves G1 and G2 are formed in the respective back surfaces of the first support member 211 and the second support member 213 to guide the sliding members SL1 and SL2. For example, the guide grooves G1 and G2 may accommodate at least a part of the guide the sliding members SL1 and SL2 of the connection member 220.

Both ends of each of the first connection member 221 and the second connection member 223 may be disposed in the first non-folding area NFA1 and the second non-folding area NFA2 on both sides of the folding area FA. The first connection member 221 and the second connection member 223 may be disposed between electronic components mounted on the first support member 211 and the second support member 213.

The first connection member 221 and the second connection member 223 may be disposed symmetrically with respect to an area between the first connection member 221 and the second connection member 223. Specifically, the first connection member 221 and the second connection member 223 may be disposed symmetrically with respect to the FPCB 305 disposed on the first support member 211 and the second support member 213. The first connection member 221 and the second connection member 223 may be disposed between the main PCB 301 mounted on the first support member 211 and the battery 302 mounted on the second support member 213.

Figure 8:
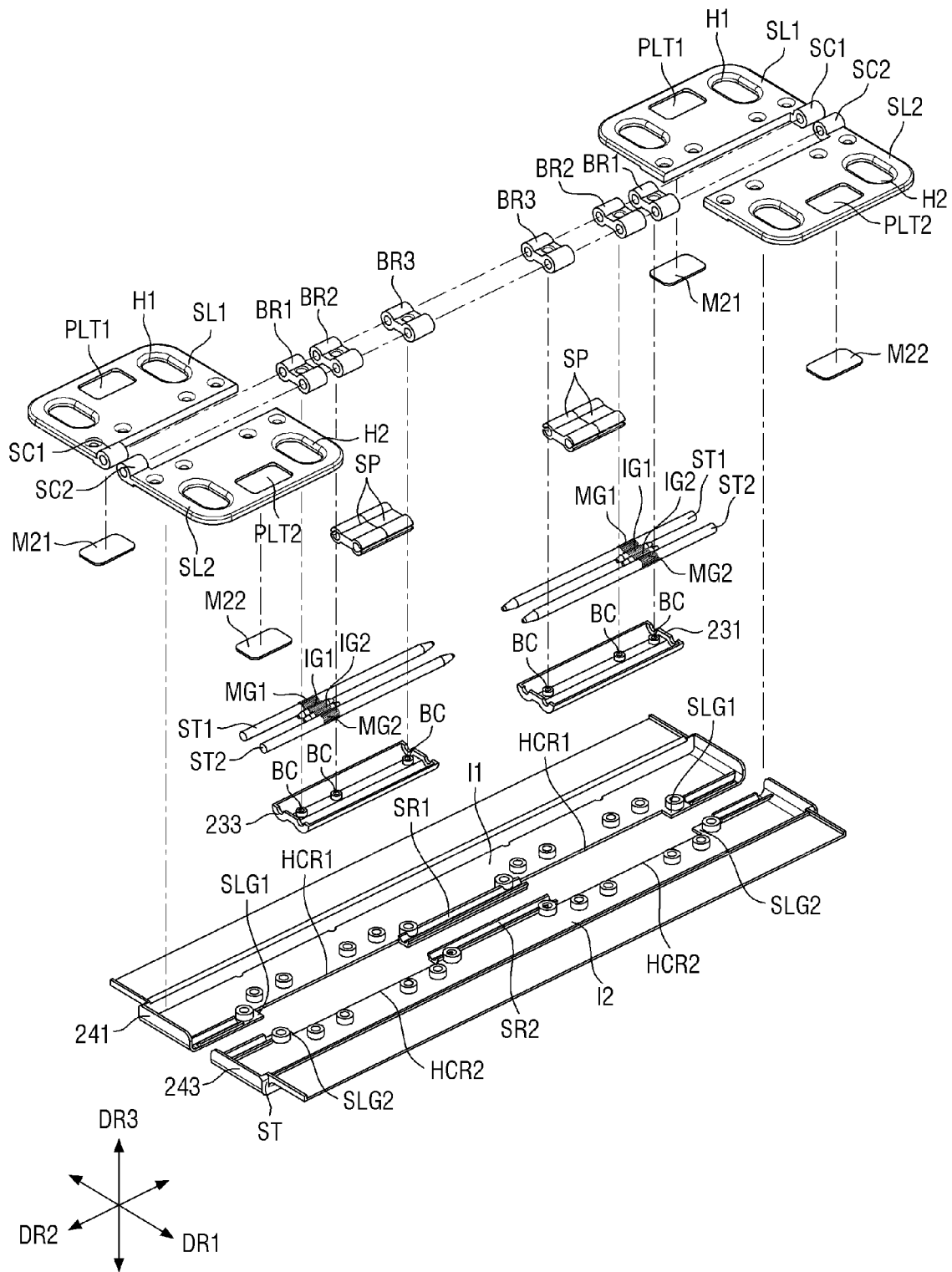
FIG. 8 is an exploded perspective view of the connection member, the hinge cover and the slide cover of FIG. 3.

Referring to FIGS. 6 to 8, each of the first connection member 221 and the second connection member 223 includes the sliding members SL1 and SL2 and the hinge member HG. The hinge member HG is disposed between the first support member 211 and the second support member 213. The hinge member HG may connect a side of the first sliding member SL1 and a side of the second sliding member SL2 and change an angle between the first sliding member SL1 and the second sliding member SL2. In FIG. 6, the hinge member HG is not visible because, the hinge member HG is covered by the hinge cover 230. The hinge member HG may be disposed only in the folding area FA.

The first sliding member SL1 and the second sliding member SL2 are slideably coupled to the first support member 211 and the second support member 213, respectively. The first sliding member SL1, the hinge member HG, and the second sliding member SL2 are sequentially arranged in a direction intersecting the folding axis FX. The first sliding member SL1 and the second sliding member SL2 may be substantially symmetrical to each other with respect to an area between the first sliding member SL1 and the second sliding member SL2. The first sliding member SL1 and the second sliding member SL2 may be disposed in the folding area FA and the non-folding areas NFA1 and NFA2. The second magnets M21 and M22 for adjusting, together with the first magnets M11 and M12 disposed on the support member 210, the torque for folding or unfolding the foldable display device 1 may be disposed on front surfaces of the sliding members SL1 and SL2.

FIG. 6 illustrates an exemplary embodiment in which the auxiliary magnets MA1 and MA2 are disposed on the support member 210. Alternatively, the auxiliary magnets MA1 and MA2 may not be disposed on the support member 210.

The hinge members HG, the sliding members SL1 and SL2, and the slide cover 240 will now be described in detail with reference to FIGS. 7 and 8.

FIG. 7 is a perspective view of the connection member 220, the hinge cover 230 and the slide cover 240 of FIG. 3. FIG. 8 is an exploded perspective view of the connection member 220, the hinge cover 230 and the slide cover 240 of FIG. 3.

Referring to FIGS. 3 and 6 through 8, each hinge member HG may include a first shaft ST1, a second shaft ST2, a first idle gear IG1, a second idle gear IG2, a first bracket BR1, a second bracket BR2, a third bracket BR3, and a stop member SP.

Each of the first shaft ST1 and the second shaft ST2 extends in the second direction DR2 (e.g., the direction of the folding axis FX). The first shaft ST1 may extend in the direction of the first rotation axis RX1 of the folding axis FX, and the second shaft ST2 may extend in the direction of the second rotation axis RX2 of the folding axis FX. The first support member 211 and the second support member 213 may be rotated by the first shaft ST1 and the second shaft ST2 with respect to the first rotation axis RX1 and the second rotation axis RX2, respectively. Ends of the first shaft ST1 and the second shaft ST2 may respectively be accommodated in a shaft accommodating rail SR1 of the first slide cover 241 and a shaft accommodating rail SR2 of the second slide cover 243 which will be described later. The first shaft ST1 and the second shaft ST2 may include a first main gear MG1 and a second main gear MG2, respectively.

The first main gear MG1 and the second main gear MG2 are integrally formed with the first shaft ST1 and the second shaft ST2, respectively, and are respectively interlocked with the first idle gear IG1 and the second idle gear IG2 to equally adjust rotation angles of the first support member 211 and the second support member 213 are equally adjusted when the foldable display device 1 is folded or unfolded. For example, the first support member 211 may have substantially the same rotation angle as the second support member 211 when the foldable display device 1 is folded or unfolded.

The first idle gear IG1 and the second idle gear IG2 are disposed between the first main gear MG1 and the second main gear MG2 to change the direction of torque transmitted from the first main gear MG1 and the second main gear MG2.

The first through third brackets BR1 through BR3 connect the first shaft ST1 and the second shaft ST2 to maintain a gap between the first shaft ST1 and the second shaft ST2. The first main gear MG1, the second main gear MG2, the first idle gear IG1 and the second idle gear IG2 may be disposed between the first bracket BR1 and the second bracket BR2, and the stop member SP may be disposed between the second bracket BR2 and the third bracket BR3. The first through third brackets BR1 through BR3 may secure a gap between members for rotation and prevent interference with other members.

Each of the first through third brackets BR1 through BR3 may include a plurality of holes. Specifically, each of the first through third brackets BR1 through BR3 may include a pair of holes formed in the second direction DR2 so that the first shaft ST1 and the second shaft ST2 can be rotatably inserted into the holes at a predetermined distance from each other. In addition, each of the first through third brackets BR1 through BR3 may further include a hole formed in the third direction DR3 so that a bracket coupling part BC of the hinge cover 230 which will be described later can be inserted into the hole.

The stop member SP is formed such that each of an end coupled to the first shaft ST1 and the other end coupled to the second shaft ST2 has a C-shaped cross section. The stop member SP may control the rotation of the first shaft ST1 and the second shaft ST2, thereby controlling the amount of the torque for folding or unfolding the foldable display device 1.

Each of the first sliding members SL1 and the second sliding members SL2 may be shaped like a plate extending from the hinge member HG in the second side direction (e.g., the outward direction) to have a predetermined width.

Respective sides of each first sliding member SL1 and each second sliding member SL2 may be rotatably coupled to the first shaft ST1 and the second shaft ST2, respectively, and the other respective sides of each first sliding member SL1 and each second sliding member SL2 may be slideably coupled to the first support member 211 and the second support member 213, respectively.

Back surfaces of each first sliding member SL1 and each second sliding member SL2 may have shapes corresponding to front surfaces of the first slide cover 241 and the second slide cover 243, respectively. Specifically, each first sliding member SL1 and each second sliding member SL2 may have a step ST formed on their back surfaces and thus respectively coupled to the first slide cover 241 and the second slide cover 243 to limit the movement of the sliding members SL1 and SL2 and the slide cover 240 in the first direction DR1.

Each first sliding member SL1 and each second sliding member SL2 may include plate parts PT1 and PT2, shaft coupling parts SC1 and SC2, the guide holes H1 and H2, and the second magnets M21 and M22, respectively.

Each of the plate parts PT1 and PT2 extends from the hinge member HG in the second side direction (e.g., the outward direction) to have a predetermined width.

The shaft coupling parts SC1 and SC2 are respectively disposed at ends of the plate parts PT1 and PT2 in the first side direction (e.g., the inward direction). The shaft coupling parts SC1 and SC2 of each first sliding member SL1 and each second sliding member SL2 respectively include grooves recessed in the second direction DR2. The grooves may rotatably accommodate respective ends of the first shaft ST1 and the second shaft ST2.

The guide holes H1 and H2 extend through the plate parts PT1 and PT2 in the thickness direction and accommodate the protruding members P1 and P2 of the first support member 211 and the second support member 213. As described above, the inner side surfaces of the guide holes H1 and H2 may have protrusions and recesses to prevent separation of the protruding members P1 and P2 from the sliding member SL.

The second magnets M21 and M22 are disposed on the plate parts PT1 and PT2. The second magnets M21 and M22 may be disposed at positions corresponding to the first magnets M11 and M12 disposed on the support member 210. The first magnets M11 and M12 and the second magnets M21 and M22 adjust the torque for folding or unfolding the foldable display device 1 by using the magnetic forces generated therebetween. The arrangement between the first magnets M11 and M12 and the second magnets M21 and M22 will be described in detail later with reference to FIGS. 9 through 14.

The first hinge cover 231 and the second hinge cover 233 may have front surfaces recessed to a predetermined depth in the backward direction. The recessed front surfaces of the first hinge cover 231 and the second hinge cover 233 may accommodate the hinge member HG of the first connection member 221 and the hinge member HG of the second connection member 223 to cover back surfaces of the hinge members HG, respectively.

Each of the first hinge cover 231 and the second hinge cover 233 may include the bracket coupling parts BC protruding in the forward direction from the front surface thereof and respectively inserted into hinge cover coupling holes of the first through third brackets BR1 through BR3 to fix the first through third brackets BR1 through BR3 to the first hinge cover 231 and the second hinge cover 233.

The slide cover 240 is disposed under the support member 210 and covers a gap between the back cover 250 and the hinge members HG of the connection member 220. The slide cover 240 may include the first slide cover 241 and the second slide cover 243 arranged along the first direction DR1. For example, the first slide cover 241 and the second slide cover 243 are spaced apart from each other in the first direction DR1.

The first slide cover 241 and the second slide cover 243 may be disposed symmetrically with respect to the area between the first support member 211 and the second support member 213 or a space between the first back cover 251 and the second back cover 253.

Each of the first slide cover 241 and the second slide cover 243 may be disposed in the folding area FA and the non-folding area NFA1 or NFA2. Specifically, the first slide cover 241 is disposed in the first non-folding area NFA1 and the folding area FA, and the second slide cover 243 is disposed in the second non-folding area NFA2 and the folding area FA.

The first slide cover 241 and the second slide cover 243 may partially overlap the is first shafts ST1 and the second shafts ST2 and/or the first sliding members SL1 and the second sliding members SL2 in the thickness direction, respectively. Specifically, the first slide cover 241 may overlap the first shafts ST1 and the first sliding members SL1, and the second slide cover 243 may overlap the second shafts ST2 and the second sliding members SL2.

The respective front surfaces of the first slide cover 241 and the second slide cover 243 may have shapes corresponding to the respective back surfaces of the first sliding members SL1 and the second sliding members SL2, respectively. Specifically, steps ST may be formed on the respective front surfaces of the first slide cover 241 and the second slide cover 243. The steps ST formed on the respective front surfaces of the first slide cover 241 and the second slide cover 243 may be engaged with the steps ST formed on the back surfaces of the first sliding members SL1 and the second sliding members SL2, respectively.

The first slide cover 241 and the second slide cover 243 may include hinge cover accommodating parts HCR1 and HCR2, back cover insertion parts I1 and I2, the shaft accommodating rails SR1 and SR2, and sliding member accommodating grooves SLG1 and SLG2, respectively.

The hinge cover accommodating parts HCR1 and HCR2 are formed at inner edges of the first slide cover 241 and the second slide cover 243 facing each other in the first side direction (e.g., the inward direction). For example, the hinge cover accommodating parts HCR1 is and HCR2 are formed by recessing the inner edges of the first slide cover 241 and the second slide cover 243 in the second side direction (e.g., the outward direction) to have a predetermined width. Thus, the hinge cover accommodating parts HCR1 and HCR2 accommodate the hinge cover 230 between the first slide cover 241 and the second slide cover 243. For example, the hinge cover 230 and the slide cover 240 may be disposed not to overlap each other and may form the exterior of the foldable display device 1. Alternatively, the inner edges of the first slide cover 241 and the second slide cover 243 may partially overlap the outer edges of the hinge cover 230, and a portion of the outer edges of the hinge cover 230 may be exposed from the first slide cover 241 and the second slide cover 243.

The back cover insertion parts I1 and I2 are disposed along long sides of the first slide cover 241 and the second slide cover 243 in the second side direction. The back cover insertion parts I1 and I2 may be inserted into an inner space formed between the support member 210 and the back cover 250 such that at least a portion of each of the back cover insertion parts I1 and I2 is placed on a front surface of the back cover 250. The back cover insertion parts I1 and I2 may slide or rotate with the back cover 250 when the foldable display device 1 is folded or unfolded. The sliding or rotation of the slide cover 240 according to the folding or unfolding of the foldable display device 1 will be described in detail later with reference to FIGS. 9 through 14.

The shaft accommodating rails SR1 and SR2 may extend between the first connection member 221 and the second connection member 223 along the second direction DR2 and may be recessed in the backward direction to rotatably accommodate the ends of the shafts ST1 and ST2.

The sliding member accommodating grooves SLG1 and SLG2 are formed by recessing the inner edges of the first slide cover 241 and the second slide cover 243 in shapes corresponding to outer circumferential surfaces of the respective shaft coupling parts SC1 and SC2 of the first sliding members SL1 and the second sliding members SL2. Thus, the sliding member accommodating grooves SLG1 and SLG2 rotatably accommodate the shaft coupling parts SC1 and SC2.

The arrangement between the magnets according to the folding or unfolding of the foldable display device 1 will now be described in detail with reference to FIGS. 9 through 14.

Figure 9:
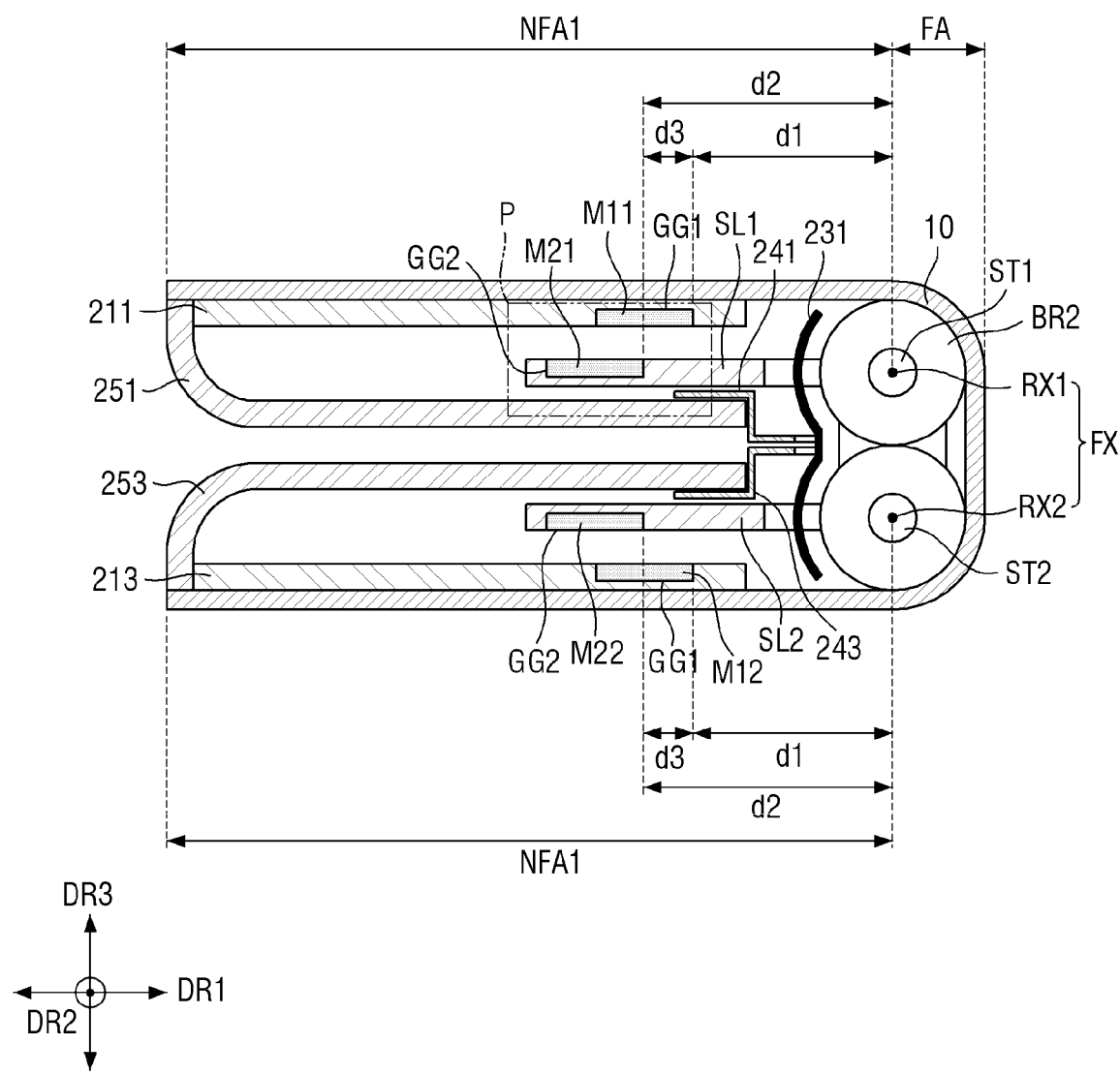
FIG. 9 is a cross-sectional view taken along line A-A' of FIG. 6 in a folded position.
Figure 11:
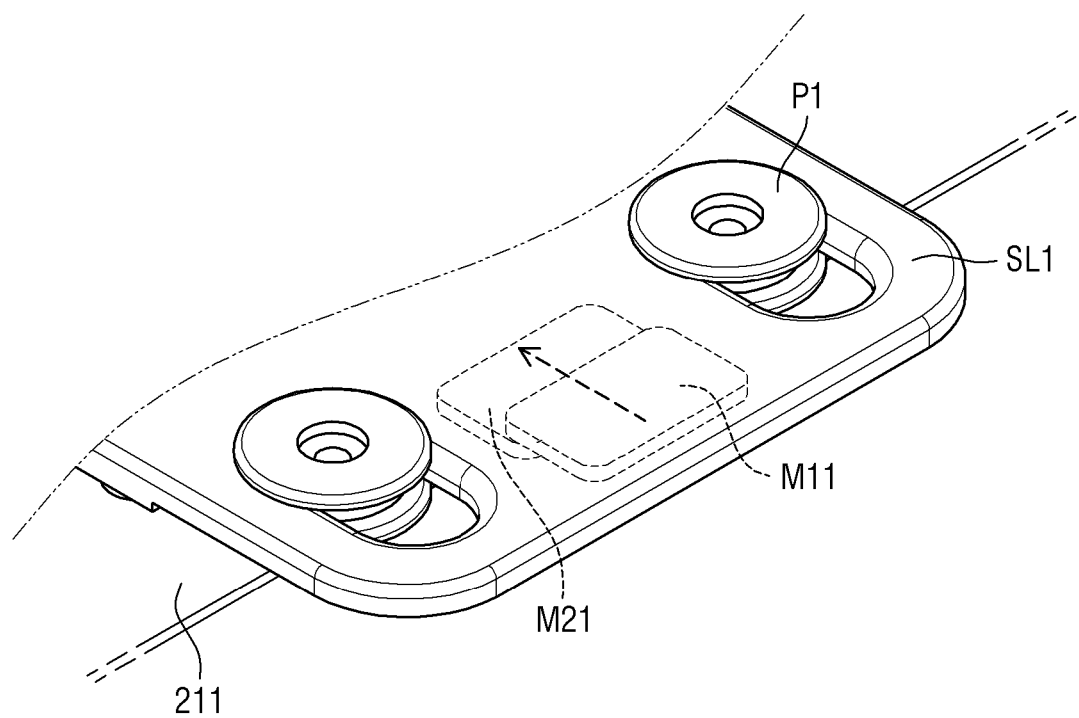
FIG. 11 is a perspective view of a sliding member of FIG. 9 as seen from the rear.

FIG. 9 is a cross-sectional view taken along line A-A' of FIG. 6 in the folded position. FIG. 10 is an enlarged view of a portion P of FIG. 9. FIG. 11 is a perspective view of the sliding member SL1 of FIG. 9 as seen from the rear.

Figure 12:
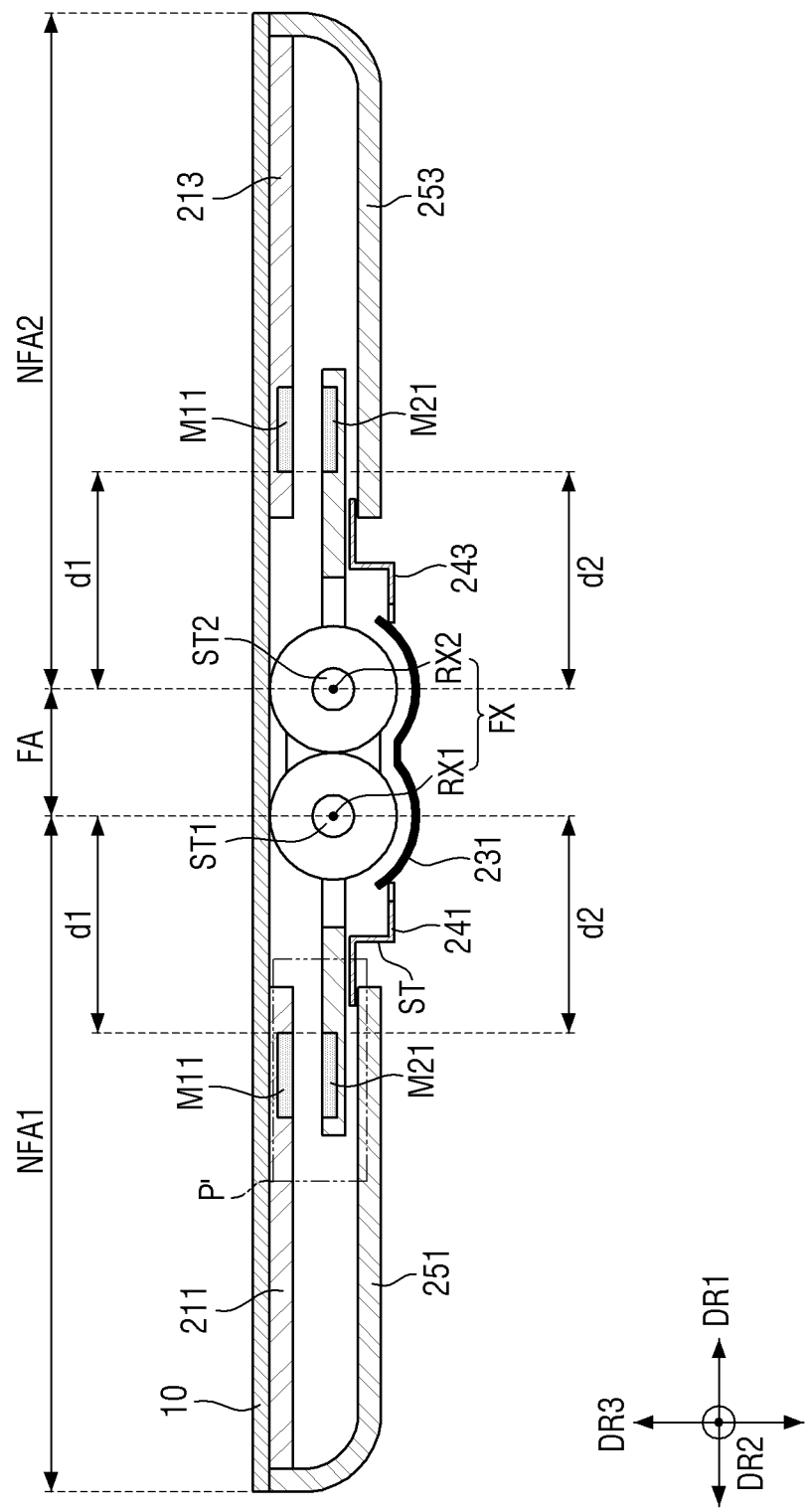
FIG. 12 is a cross-sectional view taken along line A-A' of FIG. 6 in an unfolded position.
Figure 13:
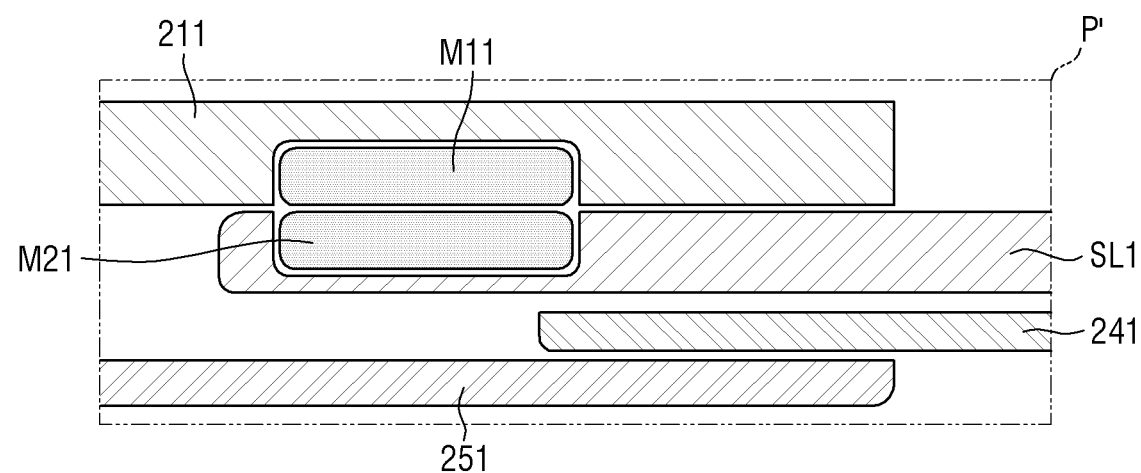
FIG. 13 is an enlarged view of a portion P' of FIG. 12.
Figure 14:
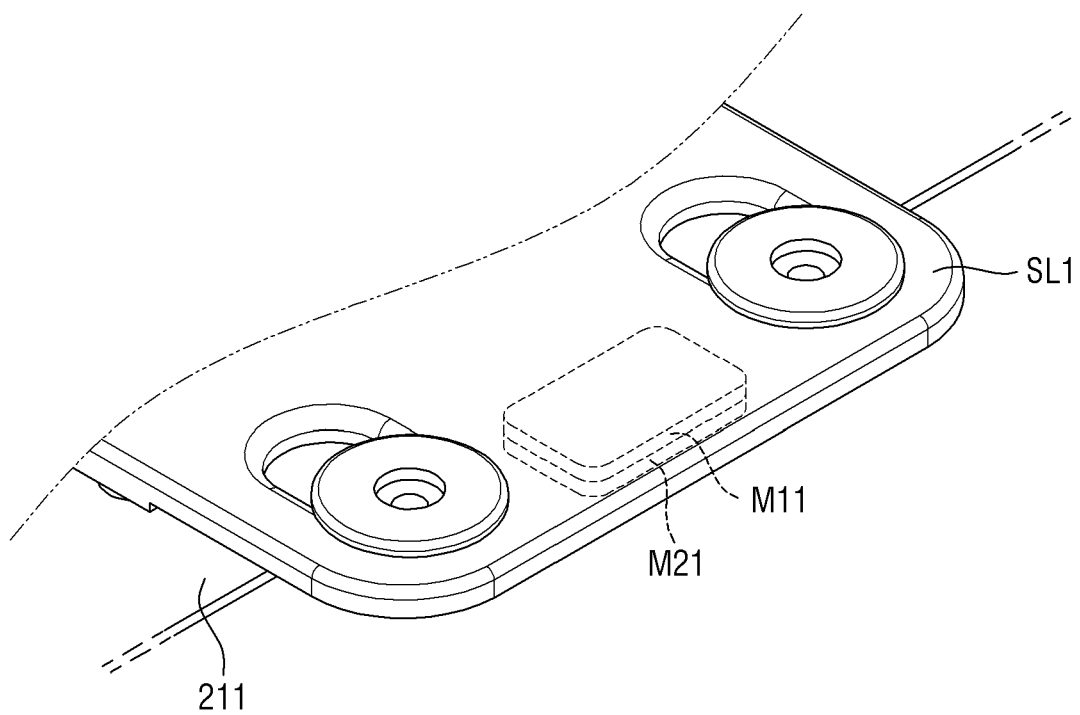
FIG. 14 is a perspective view of the sliding member of FIG. 12 as seen from the rear.

FIG. 12 is a cross-sectional view taken along line A-A' of FIG. 6 in the unfolded position. FIG. 13 is an enlarged view of a portion P' of FIG. 12. FIG. 14 is a perspective is view of the sliding member SL1 of FIG. 12 as seen from the rear.

Referring to FIGS. 9 and 12, the first magnets M11 and M12 are disposed on the back surface of the support member 210, and the second magnets M21 and M22 are disposed on the front surfaces of the sliding members SL1 and SL2. Specifically, the first magnets M11 and M12 may be inserted into first magnet accommodating grooves GG1 recessed in the forward direction from the back surface of the support member 210, and the second magnets M21 and M22 may be inserted into second magnet accommodating groove GG2 recessed in the backward direction from the front surfaces of the sliding members SL1 and SL2.

The first magnets M11 and M12 may be disposed at a first distance d1 from at least one rotation axis RX1 or RX2, and the second magnets M21 and M22 may be disposed at a second distance d2 from at least one rotation axis RX1 or RX2 in the folded position of the foldable display device 1. Specifically, the first magnet M11 of the first support member 211 and the first magnet M12 of the second support member 213 may be disposed at the first distance d1 from the first rotation axis RX1 and the second rotation axis RX2, respectively, and the second magnet M21 of the first sliding member SL1 and the second magnet M22 of the second sliding member SL2 may be disposed at the second distance d2 from the first rotation axis RX1 and the second rotation axis RX2, respectively.

The first distance d1 of the first magnets M11 and M12 may vary according to the is folded or unfolded position of the foldable display device 1. Specifically, the first distance d1 of the first magnets M11 and M12 in the folded position may be smaller than the first distance d1 in the unfolded position. This is because the support member 210 on the back surface of the display module 10 slideably moves with respect to the sliding members SL1 and SL2 due to the lost motion connection therebetween to thereby eliminate or reduce a tensile or compressive force generated in the display module 10 as the foldable display device 1 is folded or unfolded, and thus relative positions of the first magnets M11 and M12 of the support member 210 from the rotation axes RX1 and RX2 are changed.

The second distance d2 of the second magnets M21 and M22 may be kept constant regardless of whether the foldable display device 1 is folded or unfolded.

In another exemplary embodiment, the distance of the first magnet M11 of the first support member 211 from the rotation axis RX1 or RX2 and the distance of the first magnet M12 of the second support member 213 from the rotation axis RX1 or RX2 may be different, and the distance of the second magnet M21 of the first sliding member SL1 from the rotation axis RX1 or RX2 and the distance of the second magnet M22 of the second sliding member SL2 from the rotation axis RX1 or RX2 may be different.

Referring to FIGS. 9 through 14, the first magnets M11 and M12 and the second magnets M21 and M22 may be disposed in a first position in the folded position and may be disposed in a second position in the unfolded position. The second position refers to a position in which a distance between the first magnets M11 and M12 and the second magnets M21 and M22 is smaller than in the first position. In another exemplary embodiment, the first magnets M11 and M12 and the second magnets M21 and M22 may also be disposed in the second position (e.g., in the folded position) and disposed in the first position (e.g., in the unfolded position).

A third distance d3 between the first magnets M11 and M12 and the second magnets M21 and M22 in the first position may be greater than the third distance d3 between the first magnets M11 and M12 and the second magnets M21 and M22 in the second position. For example, the third distance d3 between the first magnets M11 and M12 and the second magnets M21 and M22 may correspond to the difference between the first distance d1 and the second distance d2. Specifically, the third distance d3 in the first side direction between the first magnets M11 and M12 and the second magnets M21 and M22 in the first position may be greater than the third distance d3 in the first side direction between the first magnets M11 and M12 and the second magnets M21 and M22 in the second position. The first side direction may be a direction toward the rotation axes RX1 and RX2, and the second side direction may be a direction outward the rotation axes RX1 and RX2 opposite to the first side direction.

The first magnets M11 and M12 may have substantially the same size as the second magnets M21 and M22. The size may be a length in the first side direction. Alternatively, the first magnets M11 and M12 may also have a different size from the second magnets M21 and M22.

Overlap areas between the first magnets M11 and M12 and the second magnets M21 and M22 in the first position may be smaller than overlap areas between the first magnets M11 and M12 and the second magnets M21 and M22 in the second position. Specifically, the first position may be a position in which the first magnets M11 and M12 and the second magnets M21 and M22 do not completely overlap in the thickness direction, and the second position may be a position in which the first magnets M11 and M12 and the second magnets M21 and M22 completely overlap in the thickness direction. In other words, in the second position, back surfaces of the first magnets M11 and M12 may face front surfaces of the second magnets M21 and M22.

In another exemplary embodiment, the first magnets M11 and M12 and the second magnets M21 and M22 may not overlap in the thickness direction in the first position and may at least partially overlap in the thickness direction in the second position.

The first magnets M11 and M12 and the second magnets M21 and M22 have the same polarity or different polarities.

For example, the first magnets M11 and M12 and the second magnets M21 and M22 may have different polarities to reduce the torque required for a switch from the folded position to the unfolded position and provide a fixing force for maintaining a straight angle in the unfolded position. Alternatively, the first magnets M11 and M12 and the second magnets M21 and M22 may have the same polarity to provide a fixing force for maintaining the folded position. In an exemplary embodiment, the first magnet M11 or the second magnet M21 disposed in the first non-folding area NFA1 and the first magnet M12 or the second magnet M22 disposed in the second non-folding area NFA2 may have the same polarity. In some exemplary embodiments, the first magnet M11 or the second magnet M21 disposed in the first non-folding area NFA1 and the first magnet M12 or the second magnet M22 disposed in the second non-folding area NFA2 may have different polarities.

The auxiliary magnets MA1 and MA2, the first magnets M11 and M12, and the second magnets M21 and M22 may be disposed together to adjust torque for folding or unfolding the foldable display device 1. Specifically, when an angle between the first support member 211 and the second support member 213 is less than a predetermined angle, the auxiliary magnets MA1 and MA2 may provide torque for returning to the folded position so that the foldable display device 1 is not easily unfolded. When the angle between the first support member 211 and the second support member 213 is equal to or greater than the predetermined angle, the first magnets M11 and M12 and the second magnets M21 and M22 may provide torque for switching to the unfolded position so that the foldable display device 1 can be easily unfolded. When the foldable display device 1 is fully unfolded, the first magnets M11 and M12 and the second magnets M21 and M22 may provide a fixing force for maintaining a straight angle. Here, the predetermined angle may be an angle at which a magnetic force acting between the auxiliary magnets MA1 and MA2 is smaller than a magnetic force acting between the first magnets M11 and M12 and the second magnets M21 and M22. For example, the predetermined angle may be greater than about 0 degrees to about 15 degrees.

Figure 15:
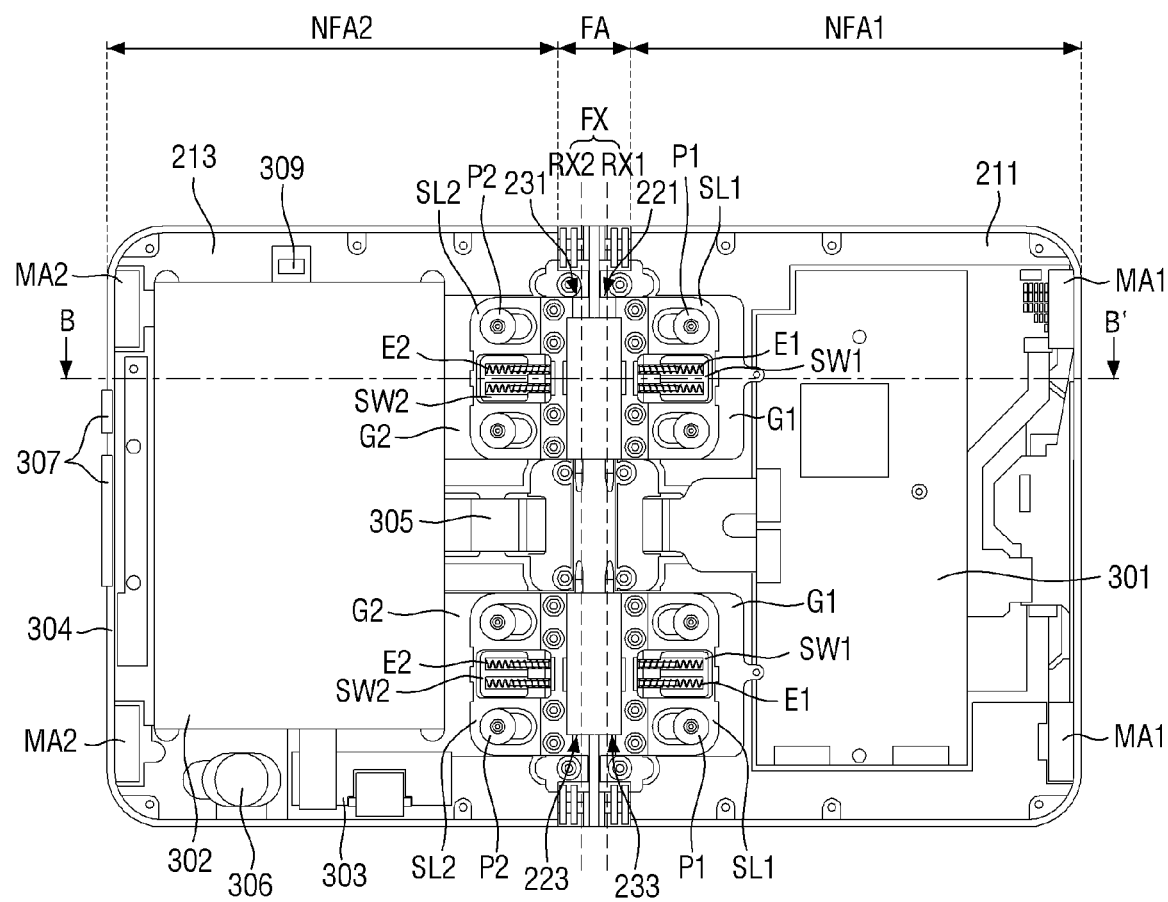
FIG. 15 is a plan view of a back surface of another exemplary embodiment of a foldable display device constructed according to the principles of the invention.
Figure 16:
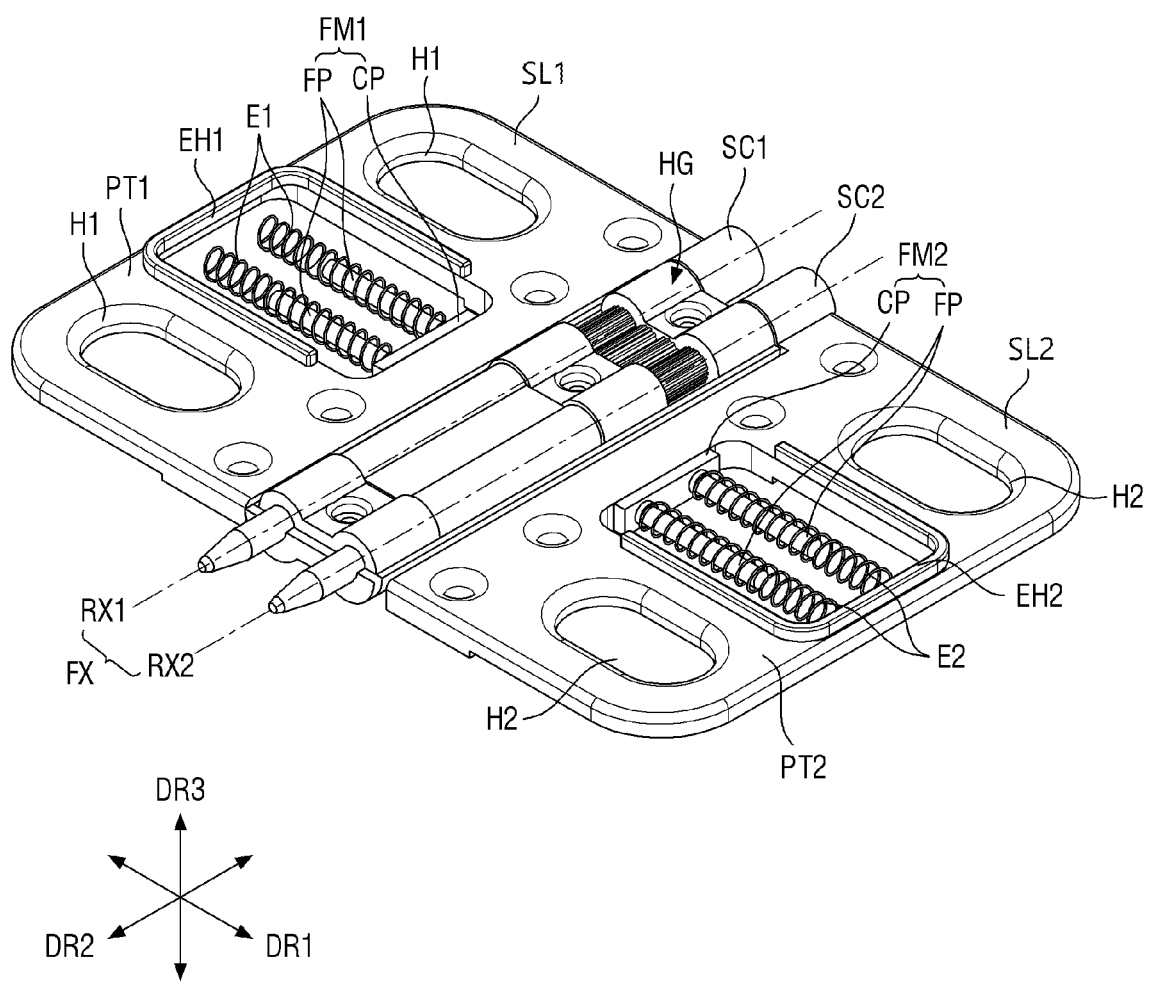
FIG. 16 is a perspective view of a connection member of FIG. 15 in an unfolded position.

FIG. 15 is a plan view of a back surface of another exemplary embodiment of a foldable display device 1 constructed according to the principles of the invention. FIG. 16 is a perspective view of a connection member of FIG. 15 in the unfolded position of the foldable display device 1.

Referring to FIGS. 15 and 16, the foldable display device 1 of FIG. 15 is different from the foldable display device 1 of FIG. 6 in that biasing members in the form of elastic members E1 and E2 are provided instead of magnets to adjust torque for folding or unfolding of the foldable display device 1.

Each first sliding member SL1 and each second sliding member SL2 may include plate parts PT1 and PT2, shaft coupling parts SC1 and SC2, guide holes H1 and H2, elastic member accommodating holes EH1 and EH2, the elastic members E1 and E2, and fixing members FM1 and FM2, respectively.

The elastic member accommodating holes EH1 and EH2 extend through the plate parts PT1 and PT2 in the thickness direction, respectively. Each of the elastic member accommodating holes EH1 and EH2 may be generally shaped like a rectangle that is long in the first side direction (e.g., a direction toward the folding axis FX). In an exemplary embodiment, each of the elastic member accommodating holes EH1 and EH2 may be disposed between a pair of guide holes H1 or H2 formed in the plate part PT1 or PT2. The fixing members FM1 and FM2 to be described later may be disposed on respective inner side surfaces of the elastic member accommodating holes EH1 and EH2 in the first side direction.

The elastic members E1 and E2 are disposed in the elastic member accommodating holes EH1 and EH2 in the first side direction. Respective sides of the elastic members E1 and E2 may respectively be supported by the fixing members FM1 and FM2, and the other respective sides of the elastic members E1 and E2 may respectively be supported by support walls SW1 and SW2 which will be described later. The elastic members E1 and E2 may be placed around fixing pins FP of the fixing members FM1 and FM2 which will be described later.

The fixing members FM1 and FM2 are disposed on the inner side surfaces of the elastic member accommodating holes EH1 and EH2 in the first side direction. Each of the fixing members FM1 and FM2 may include a pair of fixing pins FP protruding in the second side is direction (e.g., a direction outward the folding axis FX) and a connection plate CP connecting the pair of fixing pins FP.

A first back cover 251 and a second back cover 253 may respectively include the support walls SW1 and SW2 protruding from front surfaces of the first back cover 251 and the second back cover 253 and inserted into the elastic member accommodating hole EH1 of each first sliding member SL1 and the elastic member accommodating hole EH2 of each second sliding member SL2.

The compressing or stretching of the elastic members E1 and E2 according to a folded or unfolded position of the foldable display device 1 will now be described in detail with reference to FIGS. 17 through 20.

Figure 17:
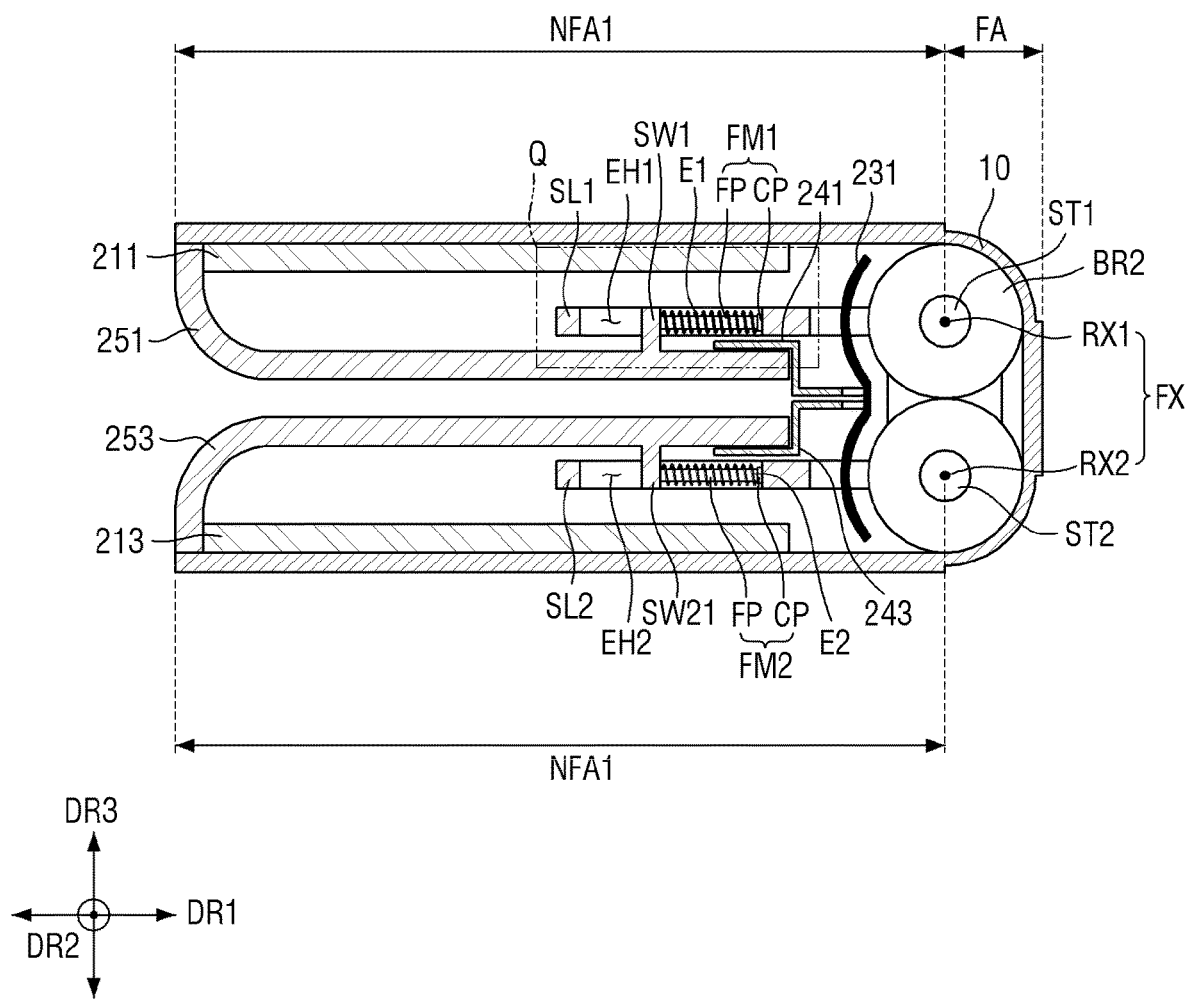
FIG. 17 is a cross-sectional view taken along line B-B' of FIG. 15 in a folded position.
Figure 18:
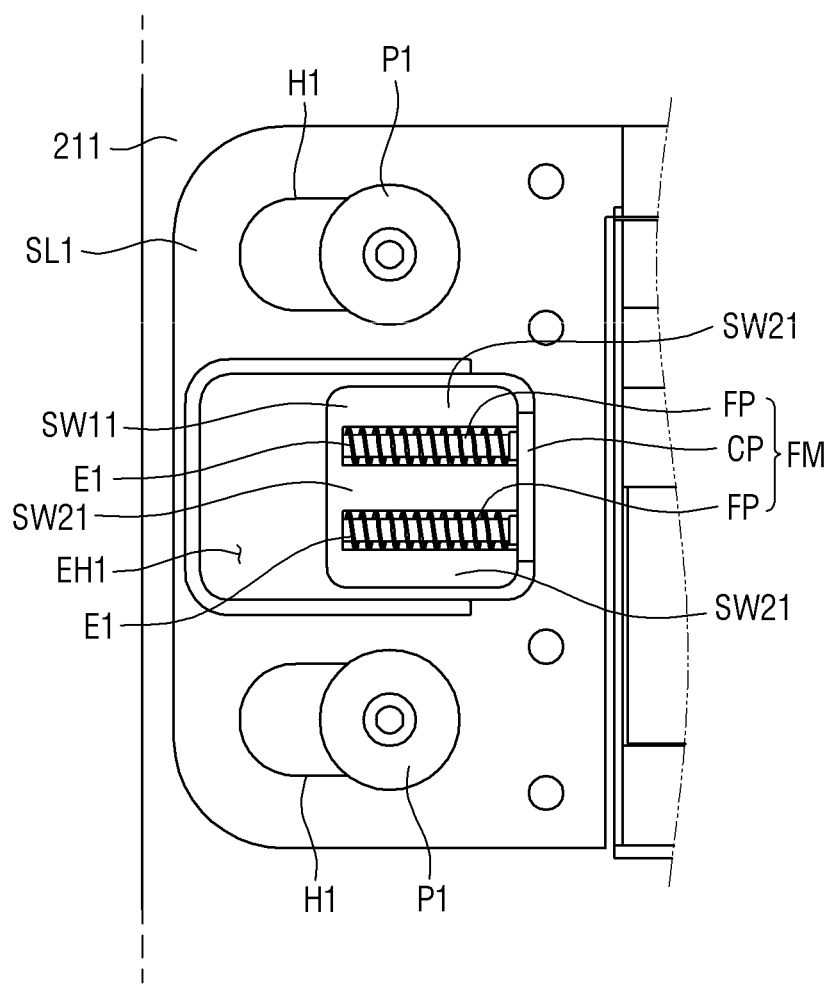
FIG. 18 is an enlarged plan view of a portion Q of FIG. 17.
Figure 19:
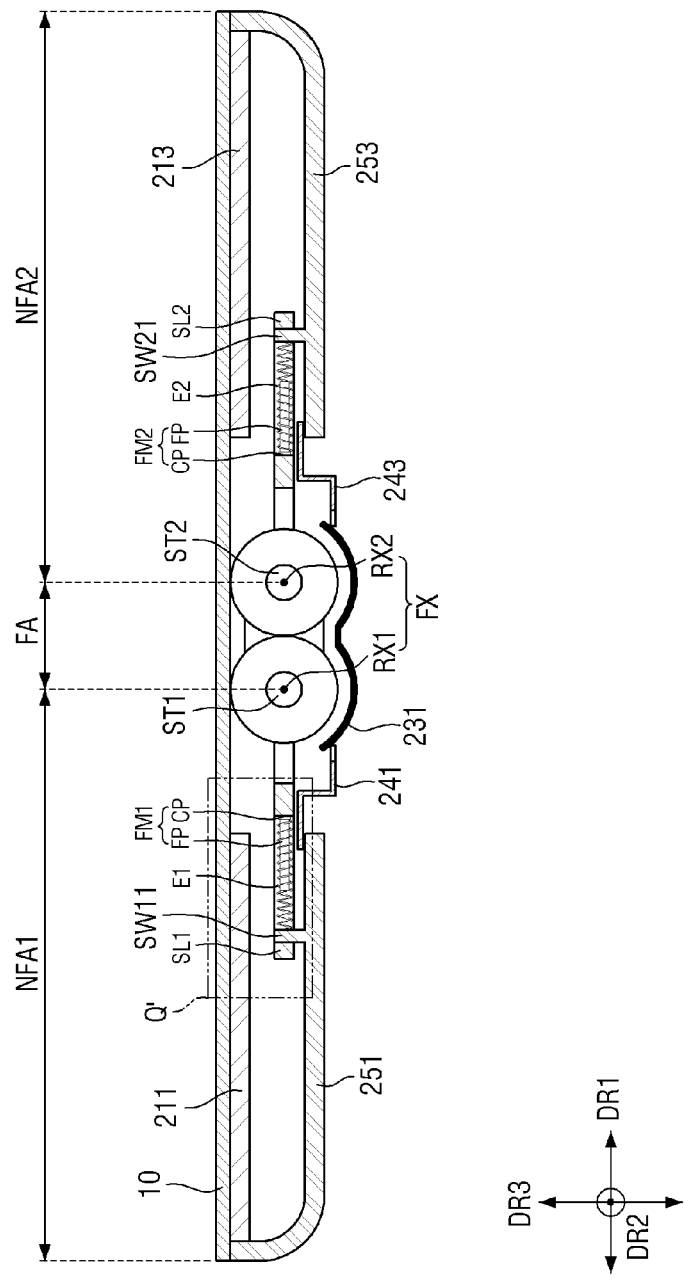
FIG. 19 is a cross-sectional view taken along line B-B' of FIG. 15 in an unfolded position.
Figure 20:
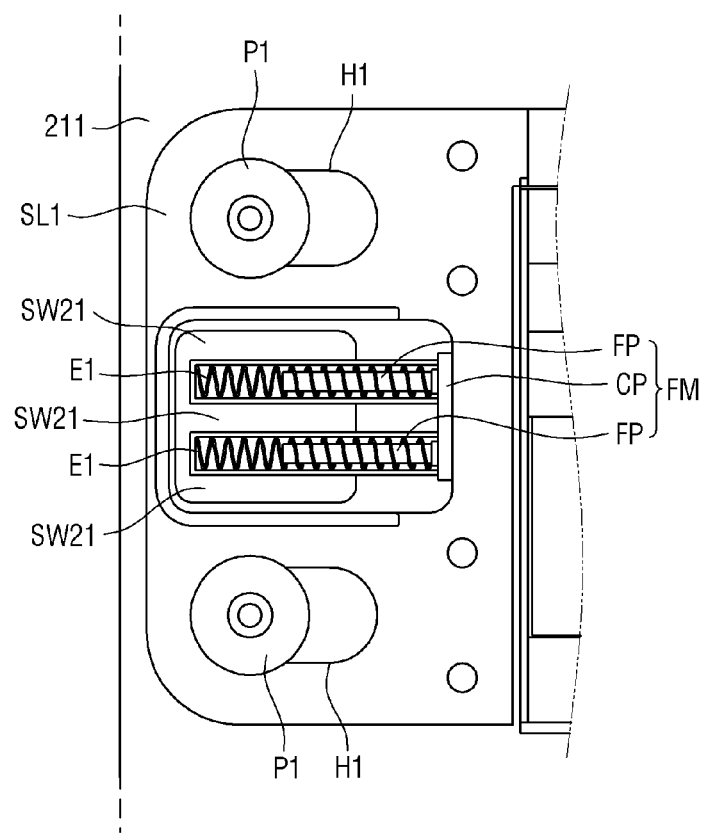
FIG. 20 is an enlarged plan view of a portion Q' of FIG. 19.

FIG. 17 is a cross-sectional view taken along line B-B' of FIG. 15 in a folded position. FIG. 18 is an enlarged plan view of a portion Q of FIG. 17. FIG. 19 is a cross-sectional view taken along line B-B' of FIG. 15 in an unfolded position. FIG. 20 is an enlarged plan view of a portion Q' of FIG. 19.

Referring to FIGS. 17 through 20, each of the support walls SW1 and SW2 may include a first support part SW11 or SW21 and a plurality of second support parts SW21 or SW22.

The first support parts SW11 and SW21 may extend in a direction along a folding axis FX to support the other sides of the elastic members E1 and E2. In the unfolded position, the first support parts SW11 and SW21 may contact inner side surfaces of the elastic member accommodating holes EH1 and EH2 in the second side direction.

The second support parts SW21 and SW22 may extend in the first side direction and limit the movement of the elastic members E1 and E2 in the direction along the folding axis FX.

Referring to FIGS. 17 through 20, the elastic members E1 and E2 are compressed or stretched according to a folded or unfolded position of the foldable display device 1. This is because relative positions of the support walls SW1 and SW2 from rotation axes RX1 and RX2 are changed as described above.

The elastic members E1 and E2 and the fixing members FM1 and FM2 may be disposed in the first side direction of the first support parts SW11 and SW21. The elastic members E1 and E2 may be compressed in the folded position and stretched in the unfolded position. Accordingly, the elastic members E1 and E2 may reduce torque required for switching from the folded position to the unfolded position of the foldable display device 1. In another exemplary embodiment, the elastic members E1 and E2 and the fixing members FM1 and FM2 may be disposed in the inner side surfaces of the elastic member accommodating holes EH1 and EH2 in the second side direction.

The elastic members E1 and E2 may be disposed together with auxiliary magnets MA1 and MA2 to adjust torque for folding or unfolding the foldable display device 1. Specifically, when an angle between the first support member 211 and the second support member 213 is less than a predetermined angle, the auxiliary magnets MA1 and MA2 may provide torque for returning to the folded position so that the foldable display device 1 is not easily unfolded. When the angle between the first support member 211 and the second support member 213 is equal to or greater than the predetermined angle, the elastic members E1 and E2 may provide torque for switching to the unfolded position so that the foldable display device 1 can be easily unfolded and. When the foldable display device 1 is fully unfolded, the elastic members E1 and E2 may provide a fixing force for maintaining a straight angle. Here, the predetermined angle may be an angle at which a magnetic force acting between the auxiliary magnets MA1 and MA2 is smaller than an elastic force provided by the elastic members E1 and E2. For example, the predetermined angle may be greater than about 0 degrees to about 15 degrees.

However, the effects of the exemplary embodiments are not restricted to the one set forth herein. The above and other effects of the exemplary embodiments will become more apparent to one of ordinary skill in the art to which the exemplary embodiments pertain by referencing the claims.

Although certain exemplary embodiments and implementations have been described herein, other exemplary embodiments and modifications will be apparent from this description. Accordingly, the inventive concepts are not limited to such exemplary embodiments, but rather to the broader scope of the appended claims and various obvious modifications and equivalent arrangements as would be apparent to a person of ordinary skill in the art.

What is claimed is:

1. A foldable display device comprising:
a display panel;
a first support member and a second support member disposed on a surface of the display panel and respectively including first biasing members;
a first member and a second member that are respectively slideably coupled to the first support member and the second support member and respectively include second biasing members;
a hinge member connected to the first member and the second member to vary an angle between the first member and the second member with respect to at least one rotation axis;
a first back cover covering a back surface of the first support member; and
a first slide cover being slideably coupled to the first back cover,
wherein the first support member is disposed between the first back cover and the display panel.

2. The foldable display device of claim 1, wherein the first support member and the second support member are supported for limited relative movement according to the angle between the first member and the second member.

3. The foldable display device of claim 2, wherein when the angle between the first member and the second member is changed, a distance between each of the first biasing members and the at least one rotation axis is changed, and a distance between each of the second biasing members from the at least one rotation axis is kept substantially constant.

4. The foldable display device of claim 3, wherein the first support member and the second support member have a folded position in which the first support member and the second support member overlap in a thickness direction and an unfolded position in which the first support member and the second support member are arranged side by side along a direction intersecting the at least one rotation axis, and a distance between the first biasing members and the second biasing members in the folded position is greater than a distance between the first biasing members and the second biasing members in the unfolded position.

5. The foldable display device of claim 4, wherein the first biasing members are disposed closer to the at least one rotation axis than the second biasing members in the folded position.

6. The foldable display device of claim 4, wherein the first biasing members and the second biasing members at least partially overlap in the thickness direction.

7. The foldable display device of claim 6, wherein an overlap area between each of the first biasing members and a corresponding second biasing member in the unfolded position is greater than an overlap area between each of the first biasing members and the corresponding second biasing member in the folded position.

8. The foldable display device of claim 7, wherein the first and the second biasing members comprise first and second magnets having different polarities.

9. The foldable display device of claim 1, wherein each of the first member and the second member comprises a slideable member including:
a plate part extending in the direction intersecting the at least one rotation axis;
a shaft coupling part disposed at an end of the plate part on a side adjacent to the at least one rotation axis; and
a pair of guide holes extending through the plate part in a thickness direction and arranged in a direction substantially parallel to the at least one rotation axis, and wherein
each of the second biasing members is disposed between the pair of guide holes.

10. The foldable display device of claim 1, further comprising:
a second back cover covering a back surface of the second support member; and
a second slide cover being slideably coupled to the second back cover, and wherein:
the first slide cover and the second slide cover have step portions,
a distance between the step portion of the first slide cover and the first back cover and a distance between the step portion of the second slide cover and the second back cover are changed when the angle between the first member and the second member is changed.

11. The foldable display device of claim 10, wherein:
the first slide cover covers an area between the at least one rotation axis and an end of the first back cover adjacent to the at least one rotation axis, and
the second slide cover covers an area between the at least one rotation axis an end of the second back cover adjacent to the at least one rotation axis.

12. The foldable display device of claim 11, wherein:
at least a part of the first slide cover overlaps the first back cover in the thickness direction, and
at least a part of the second slide cover overlaps the second back cover in the thickness direction.

13. The foldable display device of claim 12, further comprising a hinge cover disposed between the first slide cover and the second slide cover and covering a back surface of the hinge member.

14. The foldable display device of claim 1, wherein the first support member and the second support member respectively further comprise auxiliary biasing members disposed farther from the at least one rotation axis than the first biasing members and the second biasing members.

15. The foldable display device of claim 14, wherein:
the first and second biasing members comprise first and second magnets,
the auxiliary biasing members comprise auxiliary magnets, and
a magnetic force between the auxiliary magnets is smaller than a magnetic force between the first magnets and the second magnets.

16. A foldable display device comprising:
a display panel;
a first support member and a second support member disposed on a surface of the display panel;
a first member and a second member respectively slideably coupled to the first support member and the second support member, each of the first member and the second member including a pair of elastic members having longitudinal axes disposed in different planes and being substantially in parallel to each other; and
a hinge member connected to the first member and the second member to vary an angle between the first member and the second member with respect to at least one rotation axis,
wherein the pair of elastic members are configured to change a length according to an angle between the first support member and the second support member,
wherein each of the first member and the second member includes a pair of fixing members to stationary fix the pair of elastic members to each of the first member and the second member, the pair of fixing members including a pair of fixing pins extending in a first direction away from the at least one rotation axis and passing through the pair of elastic members in the first direction.

17. The foldable display device of claim 16, wherein:
the first member and the second member comprise a first slideable member and a second slideable member, respectively, each of the first member and the second member further including:
a plate part extending in the first direction intersecting the at least one rotation axis;
a shaft coupling part disposed at an end of the plate part on a side adjacent to the at least one rotation axis; and
an elastic member accommodating hole extends through the plate part in a thickness direction, and
wherein the pair of fixing members are configured to secure the pair of elastic members in the elastic member accommodating hole in the first direction.

18. The foldable display device of claim 17, further comprising:
a first back cover covering a back surface of the first support member, and
a second back cover covering a back surface of the second support member,
wherein the first back cover and the second back cover respectively comprise support walls protruding from front surfaces of the first back cover and the second back cover and inserted into the elastic member accommodating hole, and wherein ends of the pair of elastic members are supported by the pair of fixing members, and the other ends of the pair of elastic members are supported by the support walls.

19. The foldable display device of claim 18, wherein a gap between each support wall and an inner side surface of a corresponding elastic member accommodating hole varies according to the angle between the first slideable member and the second slideable member.

20. The foldable display device of claim 19, wherein:

the first support member and the second support member have a folded position in which the first support member and the second support member overlap in the thickness direction and an unfolded position in which the first support member and the second support member are arranged side by side along the first direction, and the pair of elastic members are compressed in the folded position and stretched in the unfolded position.

* * * * *